US012765287B2

(12) United States Patent
Maeda et al.

(10) Patent No.: US 12,765,287 B2
(45) Date of Patent: Oct. 13, 2026

(54) METHOD FOR PROCESSING WORKPIECE

(71) Applicant: DISCO CORPORATION, Tokyo (JP)

(72) Inventors: Atsushi Maeda, Tokyo (JP); Toshiyuki Kitamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 260 days.

(21) Appl. No.: 18/887,652

(22) Filed: Sep. 17, 2024

(65) Prior Publication Data

US 2025/0112048 A1 Apr. 3, 2025

(30) Foreign Application Priority Data

Oct. 2, 2023 (JP) ................................ 2023-171569

(51) Int. Cl.
*H10P 34/42* (2026.01)
*B23K 26/0622* (2014.01)
*B23K 26/356* (2014.01)
*B23K 26/53* (2014.01)
*B23K 103/00* (2006.01)

(52) U.S. Cl.
CPC .......... *H10P 34/42* (2026.01); *B23K 26/0624* (2015.10); *B23K 26/356* (2015.10); *B23K 26/53* (2015.10); *B23K 2103/56* (2018.08)

(58) Field of Classification Search
None
See application file for complete search history.

(56) References Cited

U.S. PATENT DOCUMENTS

2009/0032509 A1* 2/2009 Kuno ................ B23K 26/0624 219/121.72
2019/0164832 A1* 5/2019 Ueki .................. B23K 26/009
2020/0043788 A1* 2/2020 Nakamura ............ B23K 26/02
2022/0016731 A1* 1/2022 Nomaru ............ B23K 26/0622

FOREIGN PATENT DOCUMENTS

JP 2007019252 A 1/2007
JP 2012076093 A * 4/2012

* cited by examiner

*Primary Examiner* — Mohammad M Ameen
(74) *Attorney, Agent, or Firm* — Greer Burns & Crain Ltd.

(57) ABSTRACT

A method for processing a workpiece includes a setting step of setting a planned processing region, a boundary processing step of processing a boundary dividing the planned processing region into a plurality of regions or a boundary dividing the planned processing region and another region from each other, a correlation threshold value generating step of generating a correlation threshold value from correlation between energy per pulse and a pulse interval of a first laser beam configured to form a horny layer in the planned processing region, and an energy and pulse interval setting step of setting the energy per pulse of the first laser beam equal to or higher than the correlation threshold value and setting the pulse interval of the first laser beam equal to or less than the correlation threshold value.

10 Claims, 16 Drawing Sheets

E-E

METHOD FOR PROCESSING WORKPIECE

BACKGROUND OF THE INVENTION

Field of the Invention

The present invention relates to a method for processing a workpiece.

Description of the Related Art

A wafer having a plurality of devices such as integrated circuits (ICs) or large-scale integration (LSI) circuits formed on a top surface thereof in such a manner as to be demarcated by a plurality of intersecting planned dividing lines is formed to a desired thickness by having an undersurface thereof ground by a grinding apparatus, and is thereafter divided into individual device chips by a laser processing apparatus. The divided device chips are used in electric apparatuses such as mobile telephones or personal computers.

It is known that, at a time of the division into the individual device chips by the laser processing apparatus, the planned dividing lines of the wafer are set as planned processing regions, dividing grooves are formed by application of a laser beam having a wavelength absorbable by the wafer, along the planned processing regions, and the wafer is divided into the individual device chips (see Japanese Patent Laid-Open No. 2007-019252, for example).

SUMMARY OF THE INVENTION

According to the technology described in Japanese Patent Laid-Open No. 2007-019252, the application of the laser beam forms laser-processed grooves serving as a starting point of division in the top surface of the wafer, so that the wafer can be divided into the individual device chips. However, in a case where the laser-processed grooves are formed by irradiating the wafer with the laser beam having a wavelength absorbable by the wafer and thereby performing ablation processing, the ablation processing produces a large amount of debris, which adheres to the wafer. As a result, the debris contaminates the device chips, and thereby degrades the quality of the device chips.

It is accordingly an object of the present invention to provide a method for processing a workpiece which can perform control such that a region to be peeled off by forming a horny layer is precisely peeled off in an intended region when the horny layer is formed by irradiating a planned processing region with a laser beam and the horny layer is peeled off and removed from the workpiece.

In accordance with an aspect of the present invention, there is provided a method for processing a workpiece, the method including a setting step of setting a planned processing region, a boundary processing step of processing a boundary dividing the planned processing region into a plurality of regions or a boundary dividing the planned processing region and another region from each other, a correlation threshold value generating step of generating a correlation threshold value from correlation between energy per pulse and a pulse interval of a first laser beam configured to form a horny layer in the planned processing region, an energy and pulse interval setting step of setting the energy per pulse of the first laser beam equal to or higher than the correlation threshold value and setting the pulse interval of the first laser beam equal to or less than the correlation threshold value, a horny layer forming step of forming the horny layer by irradiating the planned processing region with the first laser beam, after the setting step, the boundary processing step, and the energy and pulse interval setting step are performed, and a peeling step of peeling off the horny layer from the workpiece.

Preferably, the boundary processing step includes a step of forming a groove at the boundary of the workpiece by irradiating the workpiece with a second laser beam having a wavelength absorbable by the workpiece. Preferably, the boundary processing step includes a step of forming a modified layer and a crack extending from the modified layer in an internal part corresponding to the boundary of the workpiece, by irradiating the workpiece with a third laser beam having a wavelength transmissible through the workpiece.

Preferably, the boundary processing step includes a step of forming a crack extending along a surface direction of the workpiece, by irradiating the workpiece with a fourth laser beam having a wavelength transmissible through the workpiece while positioning a condensing point of the fourth laser beam at a position corresponding to the boundary of the workpiece and at a depth corresponding to a thickness by which the horny layer is to be formed from one surface of the workpiece.

Preferably, the horny layer is generated by a chain of compressive plastic strains occurring when such a high thermal stress occurs that a local part of the workpiece irradiated with the laser beam attempts to expand rapidly and the high thermal stress is restrained by surroundings having a low temperature and exceeds a yield stress of the workpiece.

Preferably, the correlation threshold value is defined by an approximate equation, and when an axis of abscissas is set to indicate the pulse interval (μs) and an axis of ordinates is set to indicate the energy per pulse (μJ), the approximate equation is expressed by energy per pulse $=a\{b-(\text{pulse interval}/\mu s-c)^2\}$, where coefficients a, b, and c are set according to a type of the workpiece.

In a case where the workpiece is silicon (Si), preferably, settings are made such that $a=4$, $b=1$, and $c=0.9$, the approximate equation is expressed by energy per pulse $=4\{1-(\text{pulse interval}/\mu s-0.9)^2\}$, and the pulse interval is set in a range equal to or more than 0.02 μs but equal to or less than 0.8 μs.

Preferably, an irradiation pitch of the laser beam used in the horny layer forming step is set at 10 to 200 nm, and a pulse width of the laser beam is set in a range of 0.3 to 100 ps.

According to the method for processing the workpiece in accordance with the present invention, it is possible to perform control such that a region to be peeled off by forming a horny layer is precisely peeled off in an intended region when the horny layer is formed by irradiating a planned processing region with a laser beam and the horny layer is peeled off and removed from the workpiece.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
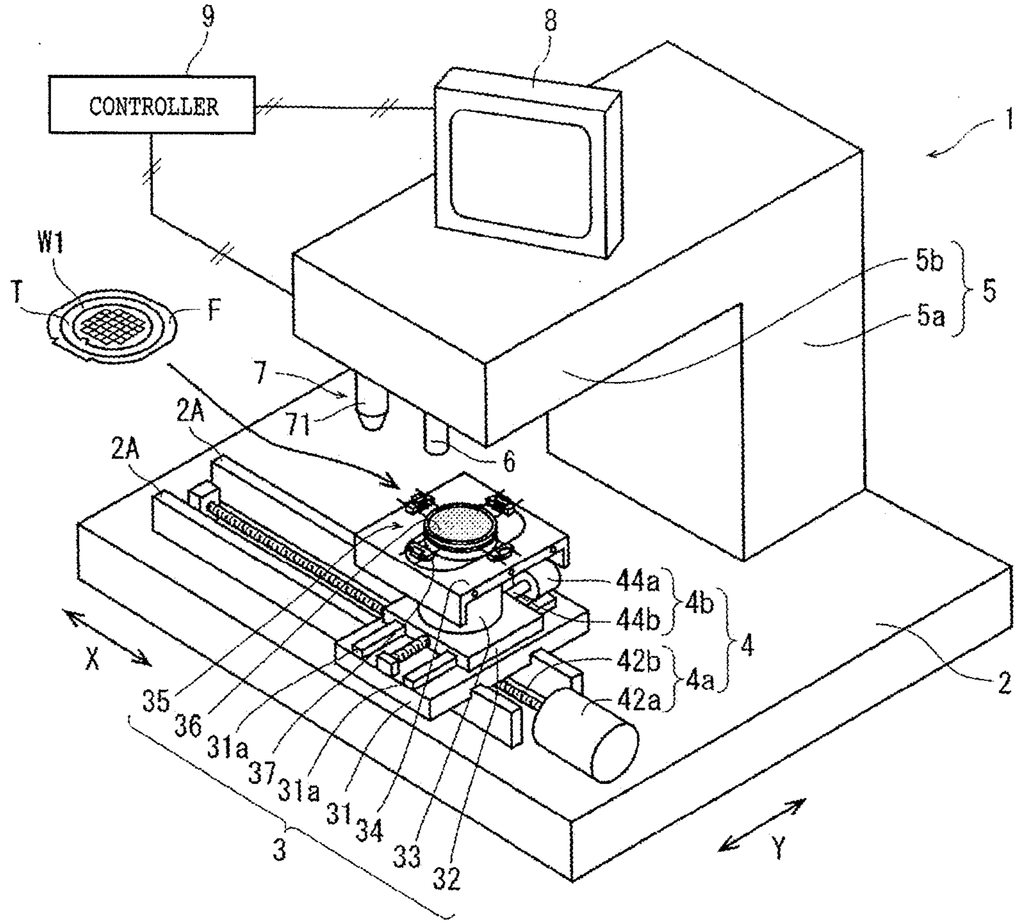
FIG. 1A is a general perspective view of a laser processing apparatus.

A workpiece processing method according to embodiments of the present invention will hereinafter be described in detail with reference to the accompanying drawings. FIG. 1A illustrates a laser processing apparatus 1 suitable for performing the workpiece processing method according to the present embodiments. The laser processing apparatus 1 is an apparatus that performs laser processing on a wafer W1 held, via a protective tape T, by an annular frame F, as illustrated in the figure. The laser processing apparatus 1 includes at least a laser beam irradiating unit 7 that is disposed above a base 2 and that irradiates the wafer W1 with a laser beam.

In addition to the laser beam irradiating unit 7 described above, the laser processing apparatus 1 includes a holding unit 3 that holds the wafer W1, an alignment unit 6 that images the wafer W1 held by the holding unit 3 and performs alignment, a moving mechanism 4 including an X-axis moving mechanism 4*a* that moves the holding unit 3 in an X-axis direction and a Y-axis moving mechanism 4*b* that moves the holding unit 3 in a Y-axis direction, a frame body 5 including a vertical wall portion 5*a* erected on a side of the X-axis moving mechanism 4*a* and the Y-axis moving mechanism 4*b* on the base 2 and a horizontal wall portion 5*b* extending in a horizontal direction from an upper end portion of the vertical wall portion 5*a*, and a controller 9 to which a display unit 8 is connected and which controls various actuating units.

The holding unit 3 is means for holding the wafer W1, the means having an XY plane defined by X-coordinates and Y-coordinates as a holding surface thereof. As illustrated in FIG. 1A, the holding unit 3 includes a rectangular X-axis direction movable plate 31 mounted on the base 2 in such a manner as to be movable in the X-axis direction, a rectangular Y-axis direction movable plate 32 mounted on the X-axis direction movable plate 31 in such a manner as to be movable in the Y-axis direction, a cylindrical column 33 fixed to an upper surface of the Y-axis direction movable plate 32, and a rectangular cover plate 34 fixed to an upper end of the column 33. The cover plate 34 is provided with a chuck table 35 extending upward through an elongated hole formed in the cover plate 34. The chuck table 35 is configured to be rotatable by an unillustrated rotational driving unit that is housed within the column 33. Disposed on an upper surface of the chuck table 35 is a circular suction chuck 36 that is formed of a porous material having air permeability and that has the XY plane defined by X-coordinates and Y-coordinates as a holding surface thereof. The suction chuck 36 is connected to unillustrated suction means by a flow passage passing through the column 33. Four clamps 37 that grip the annular frame F when the wafer W1 is held on the chuck table 35 are arranged at equal intervals on the periphery of the suction chuck 36.

The X-axis moving mechanism 4*a* constituting the moving mechanism 4 converts rotary motion of a motor 42*a* into rectilinear motion via a ball screw 42*b*, and transmits the rectilinear motion to the X-axis direction movable plate 31. The X-axis moving mechanism 4*a* thereby moves the X-axis direction movable plate 31 in the X-axis direction along a pair of guide rails 2A arranged along the X-axis direction on the base 2. The Y-axis moving mechanism 4*b* converts rotary motion of a motor 44*a* into rectilinear motion via a ball screw 44*b*, and transmits the rectilinear motion to the Y-axis direction movable plate 32. The Y-axis moving mechanism 4*b* thereby moves the Y-axis direction movable plate 32 in the Y-axis direction along a pair of guide rails 31*a* arranged along the Y-axis direction on the X-axis direction movable plate 31.

An optical system constituting the laser beam irradiating unit 7 described above and the alignment unit 6 are housed within the horizontal wall portion 5*b* of the frame body 5. Disposed on a lower surface side of a distal end portion of the horizontal wall portion 5*b* is a condenser 71 that constitutes a part of the laser beam irradiating unit 7 and that irradiates the wafer W1 with a laser beam. The alignment unit 6 is an imaging unit that images the wafer W1 held by the holding unit 3 and detects the position and orientation of the wafer W1, a laser processing position to be irradiated with the laser beam, and the like. The alignment unit 6 is disposed at a position adjacent in the X-axis direction to the condenser 71 described above.

Figure 1B:
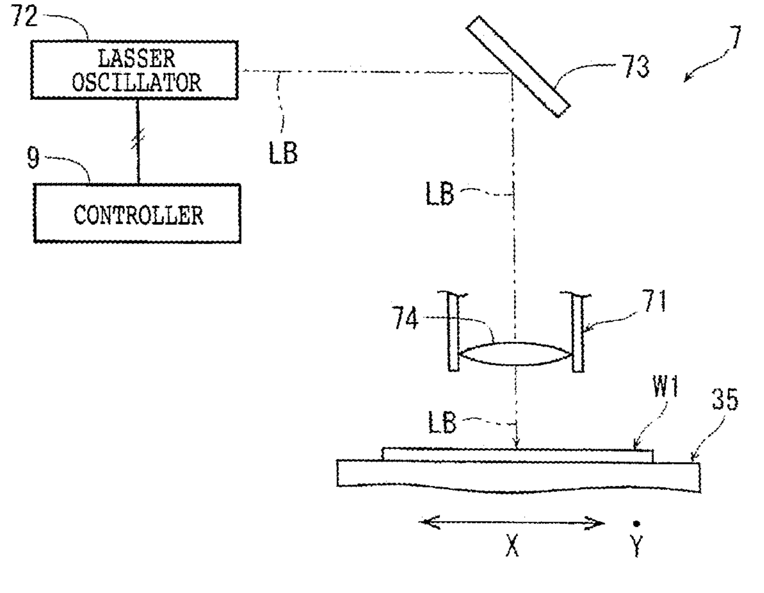
FIG. 1B is a schematic block diagram illustrating an optical system of a laser beam irradiating unit disposed in the laser processing apparatus depicted in FIG. 1A.

FIG. 1B represents a block diagram illustrating an outline of the optical system of the laser beam irradiating unit 7 described above. The laser beam irradiating unit 7 includes at least a laser oscillator 72 that emits a pulsed laser beam LB, a reflecting mirror 73 that changes the optical path of the laser beam LB emitted by the laser oscillator 72, to direct the laser beam LB to the condenser 71, and a condensing lens 74 disposed in the condenser 71 that condenses the laser beam LB onto the wafer W1 as a workpiece. In addition, the controller 9 is connected to the laser oscillator 72 of the laser beam irradiating unit 7. The controller 9 adjusts laser processing conditions (wavelength, repetition frequency, power, pulse intervals, and the like) applied at a time of emitting the laser beam LB from the laser oscillator 72. Incidentally, though omitted in FIG. 1B, the laser beam irradiating unit 7 according to the present embodiments is configured to allow the condensing lens 74 to be changed according to the laser processing conditions.

The controller 9 is constituted by a computer. The controller 9 includes a central processing unit (CPU) that performs arithmetic processing according to a control program, a read-only memory (ROM) that stores the control program and the like, a readable and writable random access memory (RAN) for temporarily storing a detected detection value, an arithmetic result, and the like, an input interface, and an output interface (which are not illustrated in detail). The controller 9 is connected with not only the laser beam irradiating unit 7 described above but also the moving mechanism 4, the alignment unit 6, the display unit 8, and the like.

The laser processing apparatus 1 according to the present embodiments roughly has the configuration as described above. The following description will be made of the embodiments of the workpiece processing method based on the present invention carried out with use of the laser processing apparatus 1 described above.

The workpiece processing method according to the present invention includes a setting step of setting a planned processing region, a boundary processing step of processing a boundary dividing the planned processing region into a plurality of regions or a boundary dividing the planned processing region and another region from each other, a correlation threshold value generating step of generating a correlation threshold value from correlation between energy per pulse and a pulse interval of a first laser beam that forms a horny layer or corneous layer in the planned processing region, and an energy and pulse interval setting step of setting the energy per pulse of the first laser beam equal to or higher than the correlation threshold value and setting the pulse interval of the first laser beam equal to or less than the correlation threshold value. The workpiece processing method further includes a horny layer forming step of forming the horny layer by irradiating the planned processing region with the first laser beam after the boundary processing step, the energy setting step, and the pulse interval setting step are performed and a peeling step of peeling off the horny layer from the workpiece.

It is to be noted that the workpiece processing method performed on the basis of the present invention is not limited to being performed by the laser processing apparatus 1 described above, and the processing apparatus may be in a form different from that of the laser processing apparatus 1 described above as long as the processing apparatus can perform the processing method to be described in the following.

First Embodiment

Figure 2A:
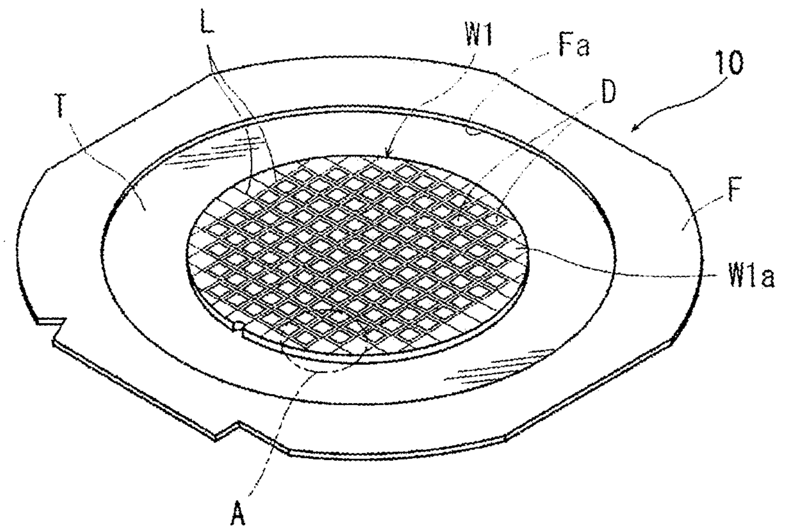
FIG. 2A is a perspective view of a frame unit including a wafer to be processed in a first embodiment of the present invention.

FIG. 2A represents a perspective view of a frame unit 10 including a wafer W1 to be processed by the workpiece processing method configured on the basis of the present invention. The wafer W1 is a Si wafer having a plurality of devices D formed on a top surface W1*a* in such a manner as to be demarcated by a plurality of intersecting planned dividing lines L. The wafer W1 is a wafer having, for example, a diameter of 200 mm and a thickness of 500 μm. The top surface W1*a* of the wafer W1 is oriented upward and positioned at the center of an opening portion Fa of the annular frame F, and the protective tape T is affixed to an undersurface of the wafer W1 (on a side opposite to the top surface W1*a*) and the annular frame F. The wafer W1 is thereby supported by the annular frame F via the protective tape T.

(Setting Step)

Figure 2B:
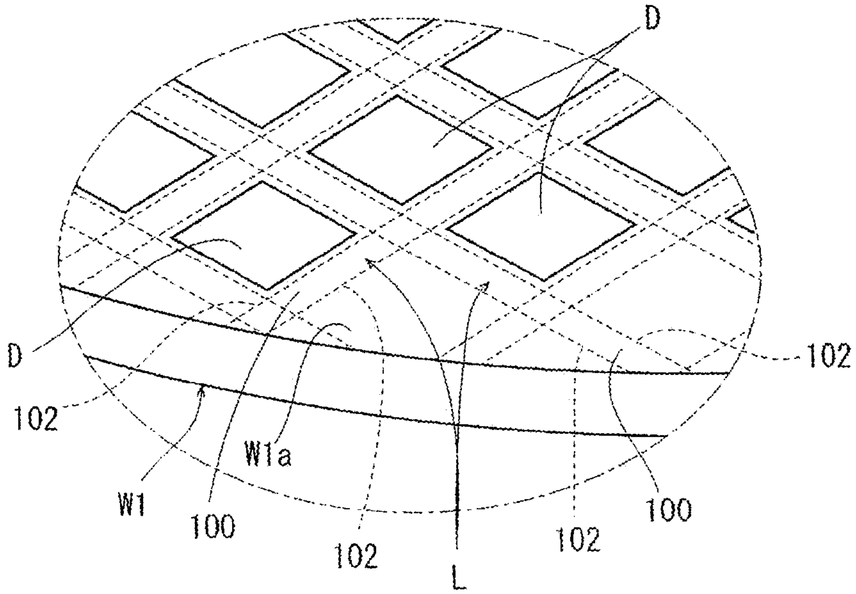
FIG. 2B is an enlarged perspective view of an A portion in FIG. 2A.

In performing the workpiece processing method according to the present embodiment, the setting step of setting a planned processing region is performed first. A planned processing region in the present embodiment is a region indicated by reference numeral 100 in FIG. 2B, in which an A portion in FIG. 2A is enlarged, is a region which is formed along a planned dividing line L of the wafer W1 and in which a horny layer is to be formed by the horny layer forming step to be described later, and is a region surrounded by boundaries 102 that divide the planned processing region 100 from other regions (regions in which a device is formed). After the position of the planned processing region 100 in the wafer W1 is set, positional information related to the planned processing region 100 is stored in the controller 9 of the laser processing apparatus 1. Incidentally, while each of the boundaries described above is indicated by a broken line in FIG. 2B for the convenience of description, each of the boundaries is not depicted on an actual wafer W1.

(Boundary Processing Step)

Performed is the boundary processing step of processing the boundaries 102 that divide the planned processing region 100 from the other regions, on the basis of the boundaries 102 defining the planned processing region 100 set by the setting step described above.

In performing the boundary processing step, first, the wafer W1 is mounted on the chuck table 35 of the laser processing apparatus 1, the wafer W1 is sucked by the unillustrated suction means being actuated and thereby a negative pressure being generated in the suction chuck, and the annular frame F supporting the wafer W1 is gripped and held by the clamps 37.

Next, the wafer W1 is moved to a position directly below the alignment unit 6 such that the top surface of the wafer W1 is imaged, the direction of a predetermined planned dividing line L (planned processing region 100) is aligned with the X-axis direction in the figure, and the coordinate positions of the planned processing region 100 and the boundaries 102 in the laser processing apparatus 1 are detected. After the coordinate positions of the planned processing region 100 and the boundaries 102 are thus detected, the positional information is stored in the controller 9 of the laser processing apparatus 1.

Figure 3A:
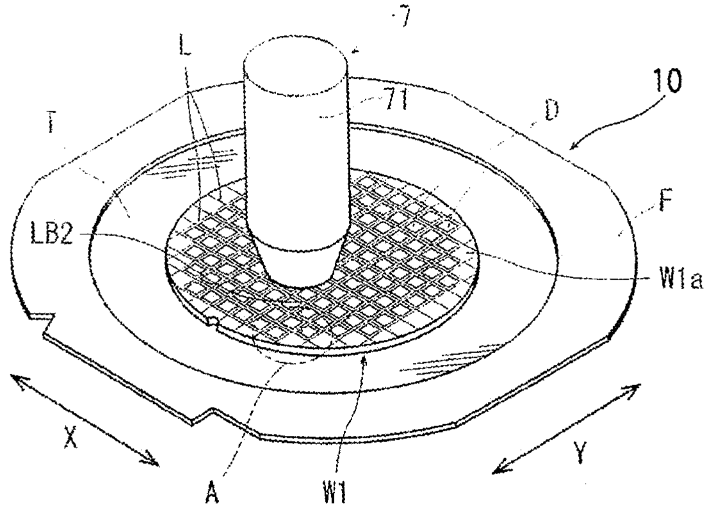
FIG. 3A is a perspective view illustrating a mode of a boundary processing step in the first embodiment.
Figure 3B:
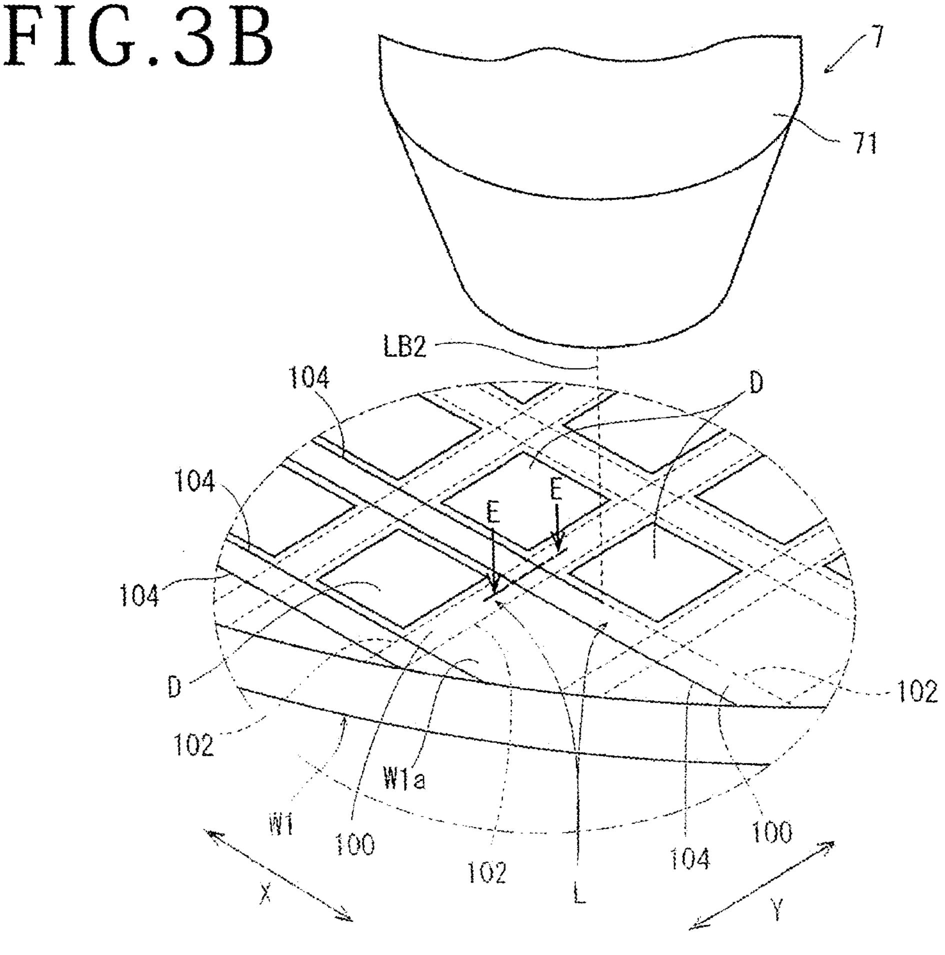
FIG. 3B is a perspective view illustrating, on an enlarged scale, a part of the mode illustrated in FIG. 3A.

On the basis of the coordinate position information related to the boundaries 102 detected by the alignment unit 6 described above, the moving mechanism 4 described above is actuated to position the condenser 71 of the laser beam irradiating unit 7 above a predetermined boundary 102 in a first direction, as illustrated in FIG. 3A. Incidentally, FIG. 3A does not illustrate the other configuration including the clamps 37 and the like for the convenience of description. Next, the condensing point of a laser beam having a wavelength absorbable by the wafer W1 (hereinafter referred to as a "second laser beam LB2") is positioned at the boundary 102 that divides the planned processing region 100 of the wafer W1, the second laser beam LB2 is applied to the wafer W1, and the X-axis moving mechanism 4*a* described above is actuated to processing-feed the wafer W1 held on the chuck table 35, in the X-axis direction. As a result, as illustrated in FIG. 3B, laser processing is performed along the predetermined boundary 102 in the first direction of the wafer W1 to form a laser-processed groove 104.

Figure 4A:
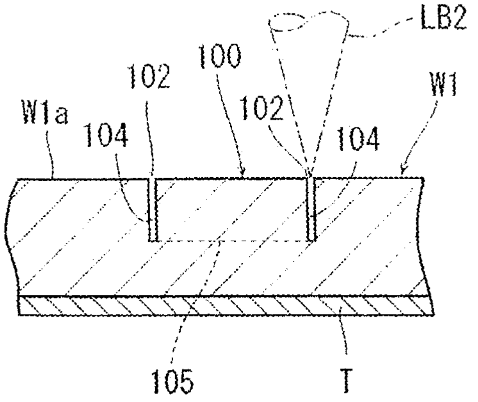
FIG. 4A is a partial enlarged cross-sectional view illustrating processed grooves obtained by the boundary processing step illustrated in FIGS. 3A and 3B.

After the laser-processed groove 104 is formed along the predetermined boundary 102, the Y-axis moving mechanism 4*b* described above is actuated to indexing-feed the wafer W1 in the Y-axis direction by the width of the planned processing region 100 or a width reaching an adjacent boundary 102 with a device D interposed between the predetermined boundary 102 and the adjacent boundary 102. An unprocessed boundary 102 adjacent in the Y-axis direction is thereby positioned directly below the condenser 71. Then, in a similar manner to that described above, the condensing point of the second laser beam LB2 is positioned at the boundary 102 of the wafer W1, the second laser beam LB2 is applied to the wafer W1, and the wafer W1 is processing-fed in the X-axis direction. A laser-processed groove 104 is thereby formed. Incidentally, the depth of the laser-processed groove 104 is set to correspond to the depth of the horny layer to be formed by the horny layer forming step to be described later (depth indicated by a broken line 105 in FIG. 4A, which illustrates an E-E cross-section in FIG. 3B). A laser-processed groove 104 having a desired depth can be formed by repeating scanning using the second laser beam LB2 along the boundary 102 a plurality of times. As a result, as is understood from FIG. 4A, the boundaries 102 that divide the planned processing region 100 from the other regions are laser-processed, and the laser-processed grooves 104 having a desired depth are thereby formed.

After laser-processed grooves 104 are formed along all of boundaries 102 along the first direction by processing-feeding and indexing-feeding the wafer W1 in the X-axis direction and the Y-axis direction as described above, the wafer W1 is rotated by 90 degrees, so that an unprocessed boundary 102 in a second direction orthogonal to the boundaries 102 where the laser-processed grooves 104 are already formed is aligned with the X-axis direction. Then, in a similar manner to that described above, the condensing point of the second laser beam LB2 is positioned also at each of the remaining boundaries 102, and the second laser beam LB2 is applied to the wafer W1. Laser-processed grooves 104 are thereby formed along the boundaries 102 that divide all of planned processing regions 100 formed on the top surface W1*a* of the wafer W1. The boundary processing step is then completed.

Incidentally, laser processing conditions (laser processing conditions 1) at a time of performing the boundary processing step that applies the second laser beam LB2 as described above are set as follows, for example.

Figure 4B:
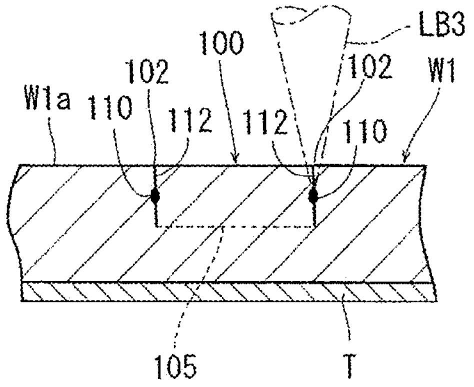
FIG. 4B is a partial enlarged cross-sectional view illustrating modified layers and cracks resulting from processing by another mode of the boundary processing step.

Wavelength: 265 nm, 532 nm, 355 nm
Average power: 40 W
Repetition frequency: 10 MHz
Pulse energy: average power/repetition frequency
Pulse interval: one second/repetition frequency The processing performed on the boundaries 102 by the boundary processing step according to the present invention is not limited to forming the laser-processed grooves 104 by performing ablation processing by application of the second laser beam LB2 having a wavelength absorbable by the wafer W1, as described above. For example, as illustrated in FIG. 4B, which corresponds to the cross-section illustrated in FIG. 4A, the condensing point of a third laser beam LB3 having a wavelength transmissible through the wafer W1 in place of the second laser beam LB2 described above is positioned in an internal part corresponding to a boundary 102, the third laser beam LB3 is applied to the wafer W1, and the moving mechanism 4 is actuated, thus forming a modified layer 110 along the boundary 102. A crack 112 is thereby formed in a depth direction, as illustrated in the figure, along the boundary 102 of the planned processing region 100 set on the planned dividing line L of the wafer W1. Incidentally, in a case where the crack 112 is to be formed precisely in the depth direction, it suffices to form a plurality of modified layers 110 by positioning the condensing point of the third laser beam LB3 at a plurality of, for example, three or more, depth positions in a position corresponding to the boundary 102 and applying the third laser beam LB3 to the wafer W1.

Incidentally, laser processing conditions (laser processing conditions 2) applied at a time of performing the boundary processing step that applies the third laser beam LB3 as described above are set as follows, for example.

Figure 4C:
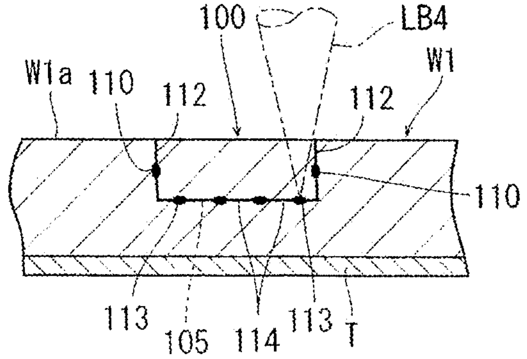
FIG. 4C is a partial enlarged cross-sectional view illustrating cut grooves resulting from processing by yet another mode of the boundary processing step.

Wavelength: 1064 nm
Average power: 1 W
Repetition frequency: 100 kHz
Pulse energy: average power/repetition frequency
Pulse interval: one second/repetition frequency Further, in the processing of the boundary processing step according to the present invention, in addition to the formation of the laser-processed grooves 104 described above in the depth direction or the formation of the cracks 112 extending in the depth direction as described above, as illustrated in FIG. 4C, for example, a plurality of modified layers 113 are formed in a surface direction of the wafer W1

(horizontal direction) by positioning the condensing point of a fourth laser beam LB4 having a wavelength transmissible through the wafer W1 at a position that corresponds to a boundary on a side opposite to an upper surface of the wafer W1 (top surface W1*a* side) and corresponds to the thickness of a region in which the horny layer is to be formed from the top surface W1*a* side (position indicated by the broken line 105), and irradiating the wafer W1 with the fourth laser beam LB4, and thereby cracks 114 that are coupled to each other by the plurality of modified layers 113 and that extend along the surface direction (horizontal direction) are formed. Such cracks 114 may be formed throughout the whole area of the planned processing region 100 described above.

The laser processing using the fourth laser beam LB can be performed under processing conditions (laser processing conditions 3) as in the following, for example.

Wavelength of the pulsed laser beam: 1064 nm
Average power: 7 to 16 W
Repetition frequency: 30 kHz
Processing feed speed: 165 mm/s Further, the processing of the boundary processing step according to the present invention is not limited to forming the laser-processed grooves by performing ablation processing by applying the laser beam having a wavelength absorbable by the wafer W1 or forming the modified layers and forming the cracks by irradiating the wafer W1 with the laser beam having a wavelength transmissible through the wafer W1 as described above. Cut grooves corresponding to the laser-processed grooves 104 described above may be formed along the boundaries 102 with use of a cutting unit that rotatably supports an annular cutting blade not illustrated in the figures.

(Correlation Threshold Value Generating Step)

Before the horny layer forming step to be described later or, more preferably, before the setting step and the boundary processing step described above, performed is the correlation threshold value generating step of generating a correlation threshold value for properly forming the horny layer to be described later in the upper surface of the workpiece (wafer W1 in the first embodiment) from correlation between energy per pulse (which will hereinafter be referred to as "pulse energy") Pe and a pulse interval Pw of a first laser beam LB1 (different from the second to fourth laser beams LB2 to LB4 described above) applied to form the horny layer in the planned processing regions 100 of the wafer W1. The correlation threshold value generating step can be performed by laser processing experiment in the laser processing apparatus 1 described above. However, the correlation threshold value generating step may be performed by another laser processing apparatus for setting the correlation threshold value. In the following description, the description will be made supposing that the correlation threshold value generating step is performed in the laser processing apparatus 1.

Figure 5:
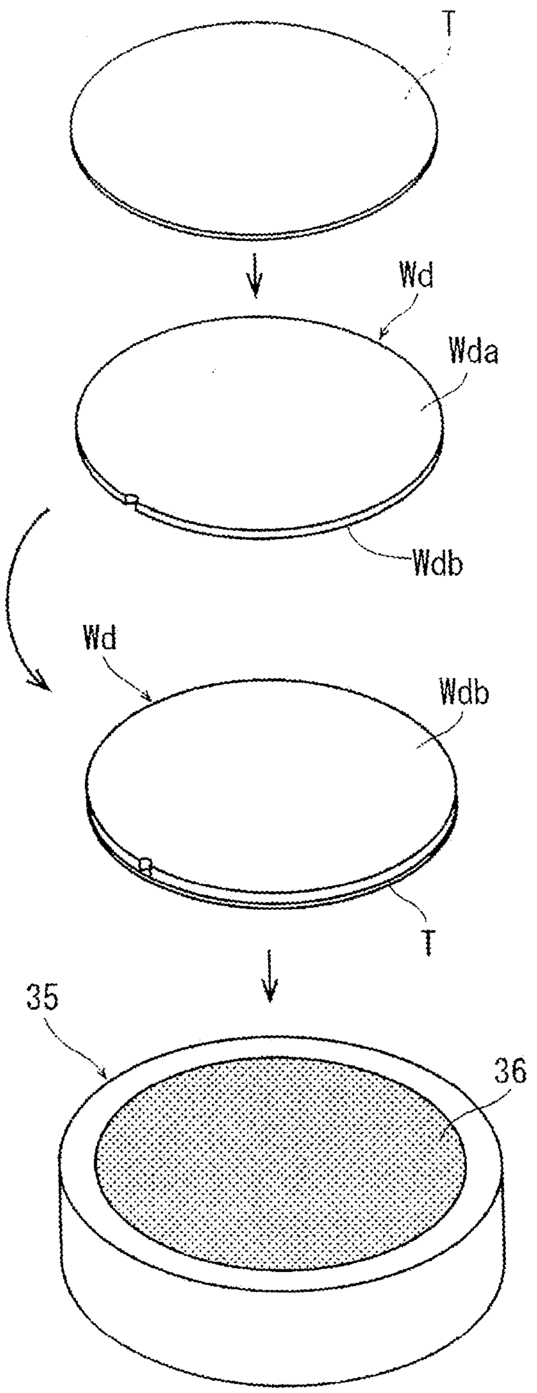
FIG. 5 is a perspective view of a dummy wafer processed by a correlation threshold value generating step.

In performing the correlation threshold value generating step, a Si dummy wafer Wd as illustrated in FIG. 5, which is formed of a material similar to that of the workpiece, is prepared. Next, the protective tape T is affixed to a top surface Wda of the dummy wafer Wd to be made integral with the dummy wafer Wd, the dummy wafer Wd is reversed to orient an undersurface Wdb of the dummy wafer Wd upward and orient the protective tape T side downward, and the dummy wafer Wd is mounted on the chuck table 35 of the laser processing apparatus 1 and held under suction thereon (configuration other than that illustrated in the figure, including the clamps 37, is omitted for the convenience of description). Incidentally, the correlation threshold value generating step uses the dummy wafer Wd on which no devices D are formed, because the correlation threshold value generating step generates, by laser processing experiment, the correlation threshold value for distinguishing a region of laser processing conditions that form the horny layer on the upper surface of the workpiece, from a region of laser processing conditions that do not form the horny layer.

Figure 6A:
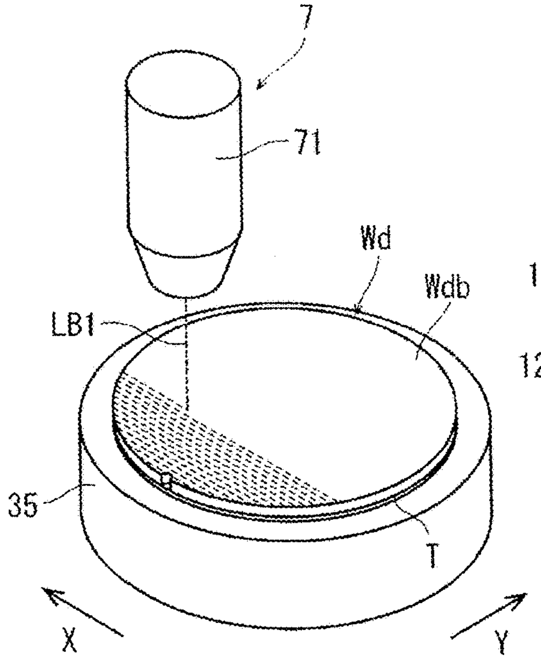
FIG. 6A is a perspective view illustrating a mode of processing the dummy wafer in the correlation threshold value generating step.
Figure 6B:
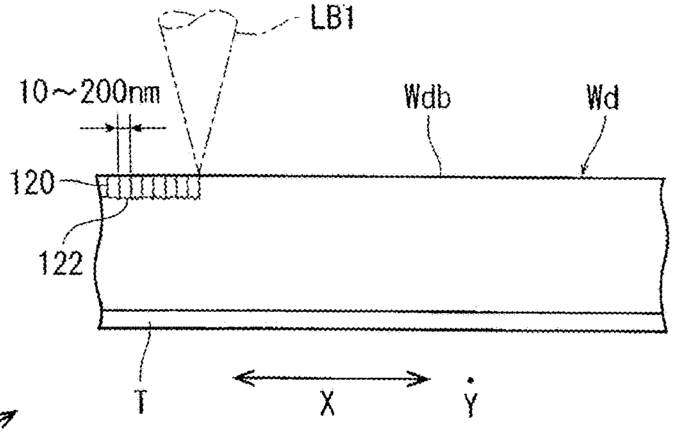
FIG. 6B is a partial enlarged cross-sectional view illustrating a horny layer formed by the processing illustrated in FIG. 6A.
Figure 7A:
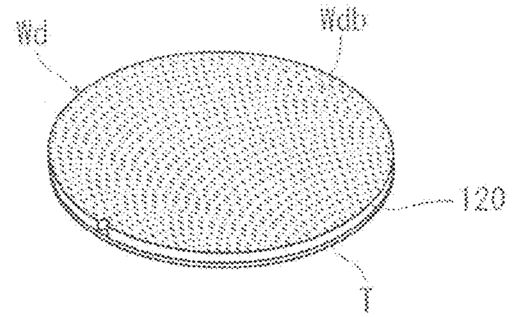
FIG. 7A is a perspective view of the dummy wafer having the horny layer formed in the whole area of a top surface thereof by the correlation threshold value generating step illustrated in FIG. 6A.

After the dummy wafer Wd described above is held on the chuck table 35, the dummy wafer Wd is positioned directly below the alignment unit 6 described above, the dummy wafer Wd is imaged and displayed on the display unit 8 as appropriate, and the external shape and the like of the dummy wafer Wd are detected. Next, on the basis of the information regarding the dummy wafer Wd detected by the alignment unit 6, the condenser 71 of the laser beam irradiating unit 7 described above is positioned at an appropriate processing start position. Next, on the basis of laser processing conditions to be described later, as illustrated in FIG. 6A and FIG. 6B, the undersurface Wdb of the dummy wafer Wd is subjected to laser processing by positioning the condensing point of the first laser beam LB1 at the undersurface Wdb of the dummy wafer Wd, applying the first laser beam LB1 to the dummy wafer Wd, and processing-feeding the dummy wafer Wd in the X-axis direction indicated by an arrow X in the figure, together with the chuck table 35. After the laser processing is thus performed, the dummy wafer Wd is indexing-fed by a predetermined interval (for example, 15 μm) in the Y-axis direction, and an unprocessed region adjacent in the Y-axis direction is positioned directly below the condenser 71. Then, in a similar manner to that described above, the condensing point of the first laser beam LB1 is positioned at the undersurface Wdb of the dummy wafer Wd, the first laser beam LB1 is applied to the dummy wafer Wd, and the dummy wafer Wd is processing-fed in the X-axis direction. By repeating such processing, the laser processing described above is performed on the entire area of the undersurface Wdb of the dummy wafer Wd, as illustrated in FIG. 7A.

Figure 7B:
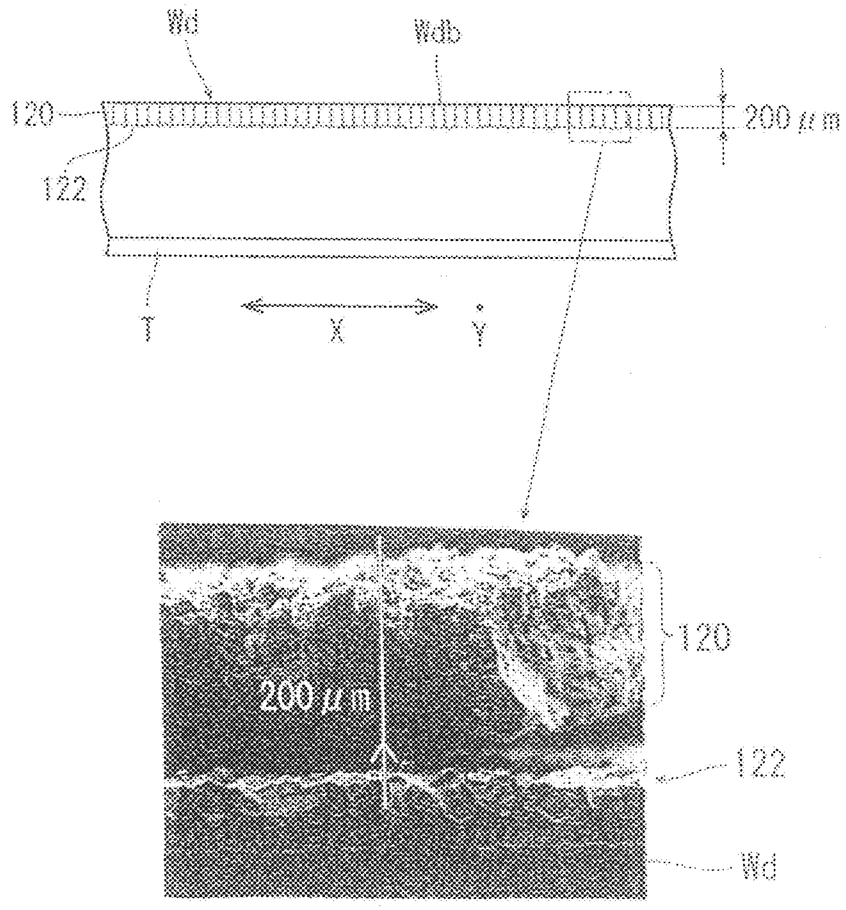
FIG. 7B is a partial enlarged cross-sectional view of the dummy wafer illustrated in FIG. 7A and a cross-sectional photograph capturing an actual object of the partial enlarged cross-sectional view.

Here, in the laser processing experiment performed in the correlation threshold value generating step described above, the laser processing conditions applied at a time of performing the laser processing are changed as appropriate, whether or not an excellent horny layer 120 is generated in the undersurface Wdb of the dummy wafer Wd as illustrated in a conceptual diagram in FIG. 7B according to correlation between the pulse energy Pe [μJ] and the pulse interval Pw [μs] is verified, and a threshold value as to whether or not an excellent horny layer 120 is generated is obtained. At a time of finding the threshold value, whether or not a horny layer 120 of excellent quality is generated by applying the laser beam LB1 may be determined after boundary processing is performed on the dummy wafer Wd under the same processing conditions as in the boundary processing step. A more accurate correlation threshold value can thereby be obtained. In addition, the dummy wafer Wd does not necessarily need to be processed throughout the entire surface thereof. Whether or not an excellent horny layer 120 is generated may be determined by processing only a part of the dummy wafer Wd. This can reduce an amount of consumption of the dummy wafer Wd.

The horny layer 120 is a layer generated by a chain of compressive plastic strains occurring when the undersurface Wdb of the dummy wafer Wd is irradiated with the first laser beam LB1 and such a high thermal stress occurs that a local part of the dummy wafer Wd attempts to expand rapidly and the high thermal stress is restrained by surroundings having a low temperature and exceeds a yield stress of Si constituting the dummy wafer Wd. As is clear from an actual image obtained by enlarging a part of an internal configuration of the dummy wafer Wd illustrated in FIG. 7B, the chain of compressive plastic strains generates an interface 122 along the XY plane within the dummy wafer Wd, and a layer to be peeled off on the upper surface side with the interface 122 as a boundary is the horny layer 120 in the present embodiment. The laser processing experiment in the present embodiment is performed by changing each parameter in a range of laser processing conditions illustrated in the following, for example.

Target wafer: Si wafer
Wavelength: 266 nm, 355 nm, 532 nm, 1064 nm
Average power: 1 to 50 W
Repetition frequency: 0.1 to 50 MHz
Pulse width: 0.3 to 1000 ps
Pulse energy Pe: average power/repetition frequency [μJ]
Pulse interval Pw: 1 [s]/repetition frequency [μs]

Of the laser processing conditions described above, the wavelengths of 266 nm, 355 nm, and 532 nm are wavelengths absorbable by Si, and the wavelength of 1064 nm is a wavelength transmissible through Si. In addition, as described above, the pulse interval Pw is a value uniquely determined by determining the repetition frequency, and the pulse energy Pe of the first laser beam LB1 is determined by determining the repetition frequency and the average power. A procedure of the laser processing experiment described above will be described more specifically in the following.

<Procedure of Laser Processing Experiment>

A) A wavelength emitted from the laser oscillator 72 of the laser beam irradiating unit 7 (532 nm in the present embodiment) is determined.

B) The average power is changed as appropriate in a range of 1 to 50 W.

C) The repetition frequency is changed as appropriate in a range of 0.1 to 50 MHz.

D) The pulse width is changed as appropriate in a range of 0.3 to 1000 ps.

E) Laser processing is performed by applying the pulsed laser beam LB.

The laser processing was performed while each value (the average power, the repetition frequency, and the pulse width) was changed by the procedure described above. Whether or not the horny layer 120 described above was formed excellently was checked by an appropriate electron microscope, and whether or not the horny layer 120 was able to be peeled off and removed from the undersurface Wdb side of the dummy wafer Wd easily was verified.

As a result of performing the laser processing while changing the processing conditions in the ranges of the laser processing conditions described above, according to the procedure of the laser processing experiment described above, and checking each time whether or not the above-described horny layer 120 was formed excellently, threshold values 1 to 10 illustrated in the following were identified as the correlation threshold value.

1) Threshold Value 1
Pulse interval Pw: 0.02 μs (repetition frequency: 50 MHz)
Pulse energy Pe: 0.25 μJ (average power: 12.5 W)

2) Threshold Value 2
Pulse interval Pw: 0.04 μs (repetition frequency: 25 MHz)
Pulse energy Pe: 0.5 μJ (average power: 12.5 W)

3) Threshold Value 3
Pulse interval Pw: 0.1 μs (repetition frequency: 10 MHz)
Pulse energy Pe: 1 μJ (average power: 10 W)

4) Threshold Value 4
Pulse interval Pw: 0.2 μs (repetition frequency: 5 MHz)
Pulse energy Pe: 1.8 μJ (average power: 9 W)

5) Threshold Value 5
Pulse interval Pw: 0.25 μs (repetition frequency: 4 MHz)
Pulse energy Pe: 2.2 μJ (average power: 8.8 W)

6) Threshold Value 6
Pulse interval Pw: 0.4 μs (repetition frequency: 2.5 MHz)
Pulse energy Pe: 3 μJ (average power: 7.5 W)

7) Threshold Value 7
Pulse interval Pw: 0.5 μs (repetition frequency: 2 MHz)
Pulse energy Pe: 3.3 μJ (average power: 6.6 W)

8) Threshold Value 8
Pulse interval Pw: 0.6 μs (repetition frequency: 1.66 MHz)
Pulse energy Pe: 3.5 μJ (average power: 5.8 W)

9) Threshold Value 9
Pulse interval Pw: 0.7 μs (repetition frequency: 1.42 MHz)
Pulse energy Pe: 3.6 μJ (average power: 5.1 W)

10) Threshold Value 10
Pulse interval Pw: 0.8 μs (repetition frequency: 1.25 MHz)
Pulse energy Pe: 3.8 μJ (average power: 4.75 W)

Incidentally, the present inventors performed the laser processing also under the following laser processing conditions exceeding the threshold value 10 in the laser processing experiment described above, but the horny layer 120 was not generated excellently. Thus, the following laser processing conditions were confirmed to be a limit value at which the horny layer 120 is not generated excellently.

Pulse interval Pw: 0.9 μs (repetition frequency: 1.11 MHz)
Pulse energy Pe: 3.8 μJ (average power: 4.22 W)

Figure 8:
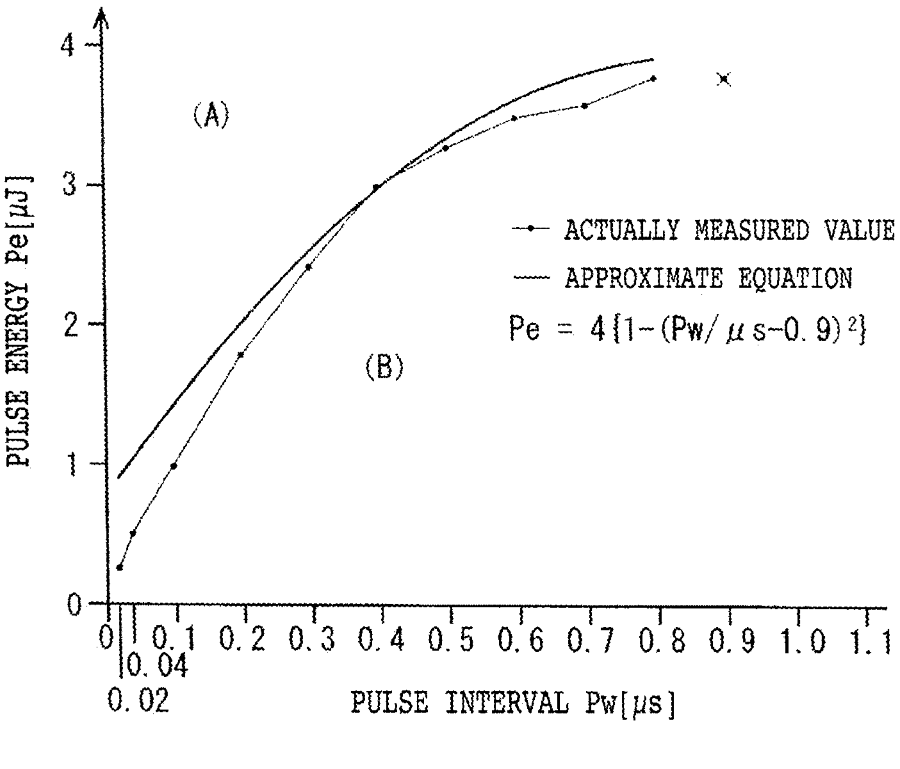
FIG. 8 is a correlation diagram generated by the correlation threshold value generating step.

The threshold values 1 to 10 described above are illustrated in a state of being connected to each other by straight lines after being plotted as actually measured values in a correlation diagram in which an axis of abscissas indicates the pulse interval Pw [μs] and an axis of ordinates indicates the pulse energy Pe [μJ], as illustrated in FIG. 8 (the above-described limit value is denoted by x for reference). The threshold values 1 to 10 are actually measured values obtained, by the laser processing experiment described above, as the correlation threshold value that divides a region (A) in which the above-described horny layer 120 is formed excellently, from a region (B) in which the horny layer 120 is not formed excellently. That is, it has been confirmed by the laser processing experiment described above that an excellent horny layer 120 is formed when the laser processing conditions are set in the region (A) in which the pulse energy Pe is equal to or higher than the correlation threshold value and the pulse interval Pw is equal to or less than the correlation threshold value, and that an excellent horny layer 120 is not formed when the laser processing conditions are set in the region (B) in which the pulse energy Pe is lower than the correlation threshold value and the pulse interval Pw is larger than the correlation threshold value. This correlation threshold value is stored in the controller 9.

Incidentally, a similar correlation threshold value was obtained also in a case where the above-described laser processing experiment was performed after other wavelengths of 266 nm and 355 nm absorbable by the Si wafer were selected as the wavelength of the first laser beam LB1 to be applied in the laser processing experiment described above, whereas an excellent horny layer was not formed in any region in a case where the laser processing experiment described above was performed after the wavelength of 1064 nm transmissible through the Si wafer was selected as the wavelength of the first laser beam LB1 to be applied.

As described above, the correlation threshold value at which an excellent horny layer can be formed in the upper surface of the workpiece is generated from the correlation between the pulse energy Pe as energy per pulse and the pulse interval Pw, and the correlation threshold value is stored in the controller 9. The correlation threshold value generating step is thereby completed.

Incidentally, in place of generating the correlation threshold value on the basis of the actually measured values as described above, the correlation threshold value generating step in the present invention may generate an approximate equation on the basis of the correlation threshold value, and set the approximate equation as the correlation threshold value. The present inventors have found that the correlation threshold value based on the above-described actually measured values can be approximated by an approximate equation (1) illustrated in the following, in the ranges of the laser processing experiment in which an excellent result was presented by the laser processing experiment at the time of generating the correlation threshold value described above.

The approximate equation (1) is defined as follows when an axis of abscissas is set to indicate the pulse interval Pw [μs] and an axis of ordinates is set to indicate the pulse energy Pe [μJ].

$$Pe = a\{b - (Pw/\mu s - c)^2\} \quad (1)$$

The pulse interval Pw is made dimensionless by being divided by the unit [μs].

Coefficients a, b, and c are set as appropriate according to the type of the workpiece (for example, Si, silicon carbide (SiC), gallium nitride (GaN), sapphire, or the like).

The laser processing experiment described above is an experiment performed on the dummy wafer Wd of Si. It has been found that, in a case where the above-described approximate equation (1) is applied to the dummy wafer Wd of Si, the approximate equation (1) can be used as the correlation threshold value at which an excellent horny layer 120 is generated, by setting the coefficients a, b, and c at a=4, b=1, and c=0.9 at least in a range in which the pulse interval Pw is equal to or more than 0.02 μs but equal to or less than 0.8 μs. That is, the approximate equation (1) is expressed by the following approximate equation (2), and laser processing conditions that enable an excellent horny layer 120 to be generated can be set easily by using the following approximate equation (2).

$$Pe = 4\{1 - (Pw/\mu s - 0.9)^2\} \quad (2)$$

Incidentally, in the present embodiment, the correlation threshold value is obtained while both the pulse energy and the pulse interval are changed in the correlation threshold value generating step. However, the correlation threshold value may be obtained by processing the dummy wafer Wd while only the pulse energy is changed after the pulse interval is fixed at a predetermined value. In addition, the correlation threshold value may be obtained by processing the dummy wafer Wd while only the pulse interval is changed after the pulse energy is fixed at a predetermined value.

(Energy and Pulse Interval Setting Step)

Performed is the energy and pulse interval setting step of, with use of the correlation threshold value obtained by the correlation threshold value generating step described above, setting the pulse energy Pe as energy per pulse of the first laser beam LB1 equal to or higher than the correlation threshold value and setting the pulse interval Pw of the first laser beam LB1 equal to or less than the correlation threshold value.

Specifically, for the wafer W1 as the workpiece described above, the controller 9 sets the laser processing conditions in which the pulse energy Pe of the first laser beam LB1 applied from the laser beam irradiating unit 7 is equal to or higher than the correlation threshold value and the pulse interval Pw is equal to or less than the correlation threshold value. That is, the laser processing conditions that allows the laser processing apparatus 1 to perform irradiation with the pulse energy Pe and the pulse interval Pw of the first laser beam LB1 within the region (A) in the correlation diagram illustrated in FIG. 8 are set and stored. Incidentally, when the pulse interval Pw is decreased by raising the repetition frequency, the horny layer 120 can be formed reliably with a lower pulse energy Pe. In addition, when the pulse energy Pe is increased, the thickness of the horny layer 120 can be adjusted more widely. Thus, the pulse energy Pe and the pulse interval Pw of the first laser beam LB1 are set in consideration of energy efficiency, the thickness of the horny layer 120 to be formed, and the like. In addition, when the value of the pulse energy Pe of the first laser beam LB1 is too high, leakage light may reach and cause damage to the outside of the planned processing region 100 irradiated with the first laser beam LB1, for example, a region in which a device D is formed. The pulse energy Pe is therefore set in a range in which the effect of the leakage light does not occur.

(Horny Layer Forming Step)

After at least the setting step, the boundary processing step, and the energy and pulse interval setting step are performed, performed is the horny layer forming step of forming the horny layer by irradiating the above-described planned processing region 100 with the first laser beam LB1. Incidentally, the correlation threshold value generating step in the first embodiment is performed in advance before the boundary processing step described above, and the horny layer forming step to be described in the following is performed by the laser processing apparatus 1 following the boundary processing step described above. In addition, it has been confirmed in the laser processing experiment in the correlation threshold value generating step that the thickness of the horny layer 120 and the thickness of the interface 122 are formed stably by setting the pulse width of the first laser beam LB1 in a range of 0.3 to 100 μs. Hence, the pulse width is set in the above-described range in the above-described energy and pulse interval setting step. In addition, it has been also confirmed in the above-described laser processing experiment that an excellent horny layer 120 is formed in a case where the irradiation pitch of the first laser beam LB1 applied to the dummy wafer Wd is 10 to 200 nm (see FIG. 6B). An adjustment is made to achieve the above-described irradiation pitch range by adjusting the processing feed speed in the X-axis direction as appropriate according to the repetition frequency of the first laser beam LB1. The horny layer forming step is performed by setting the laser processing conditions (laser processing conditions 4) on the basis of the pulse energy Pe and the pulse interval Pw adjusted in such a manner and set on the basis of the energy and pulse interval setting step described above.

In performing the horny layer forming step, the condensing lens 74 of the condenser 71 used in the boundary processing step is preferably replaced as appropriate. In a case where a laser-processed groove 104 is formed in the boundary processing step described above, the boundary 102 defining the planned processing region 100 in which the horny layer is to be formed is irradiated with the second laser beam LB2. At this time, a beam diameter is reduced (thinned) by using a condensing lens having a large numerical aperture (NA) as compared with laser processing for forming the horny layer. Consequently, the laser-processed groove 104 can be formed precisely, and the fluence of the second laser beam LB2 is increased. A laser beam more suitable for ablation processing is thus obtained. When the first laser beam LB1 is applied in the horny layer forming step, in contrast, the condensing lens 74 is replaced with a condensing lens having a small NA. Consequently, the beam diameter of the first laser beam LB1 is increased, and the fluence of the first laser beam LB1 is decreased. A laser beam more suitable for the formation of the horny layer is thus obtained.

Figure 9A:
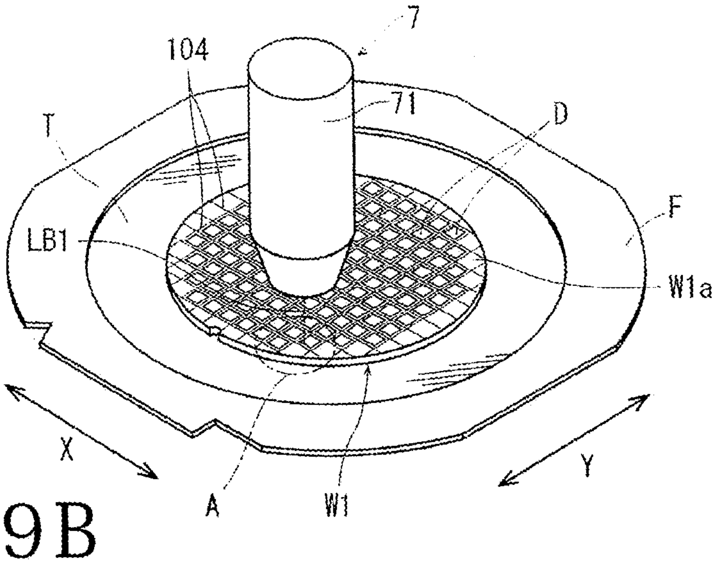
FIG. 9A is a perspective view illustrating a mode of a horny layer forming step.
Figure 9B:
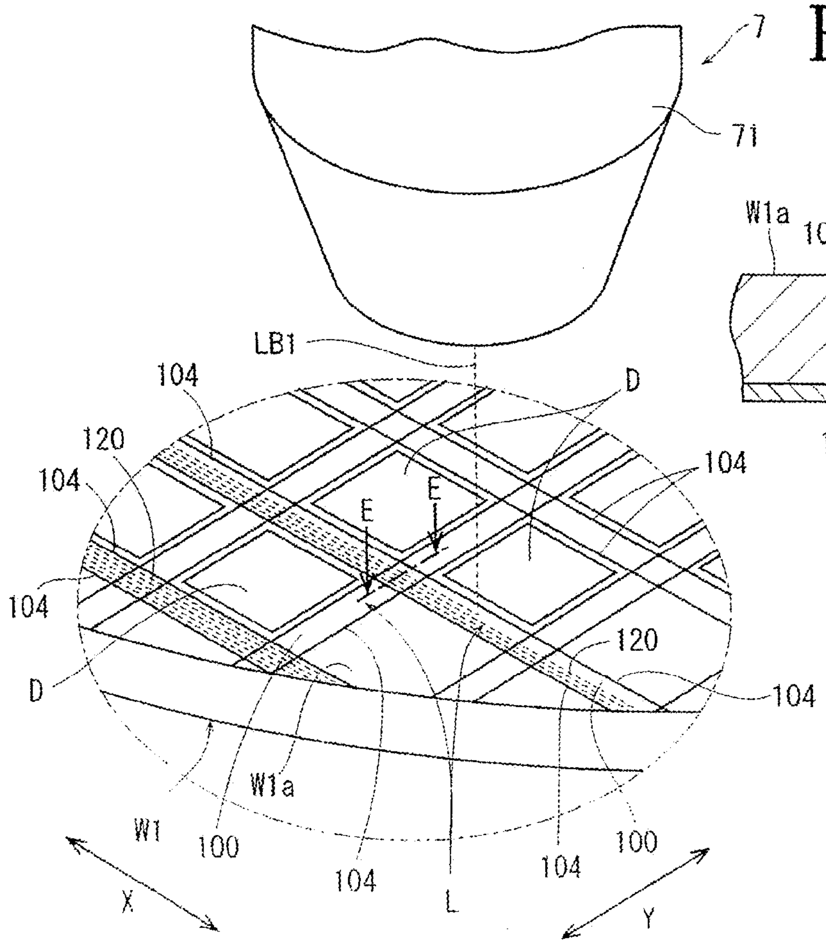
FIG. 9B is a perspective view illustrating, on an enlarged scale, a part of the mode illustrated in FIG. 9A.

In performing the horny layer forming step, on the basis of the positional information related to a planned processing region 100 obtained by the alignment unit 6 described above, as illustrated in FIG. 9A, the condensing point of the first laser beam LB1 for which processing conditions are set on the basis of the laser processing conditions 4 described above is positioned at a desired planned processing region 100 positioned along the X-axis direction on the top surface W1*a* of the wafer W1 and sandwiched by the laser-processed grooves 104 processed by the boundary processing step and formed along the boundaries 102, the first laser beam LB1 is applied to the wafer W1, and the X-axis moving mechanism 4*a* described above is actuated to processing-feed the wafer W1. Then, the Y-axis moving mechanism 4*b* described above is actuated to move the chuck table 35 in the Y-axis direction and thereby indexing-feed the condensing point of the first laser beam LB1 by an interval of 15 μm, for example, in the Y-axis direction within the planned processing region 100, as illustrated in FIG. 9B, and scanning with the first laser beam LB1 is performed. The horny layer 120 is thereby formed in the top surface within the planned processing region 100.

Figure 9C:
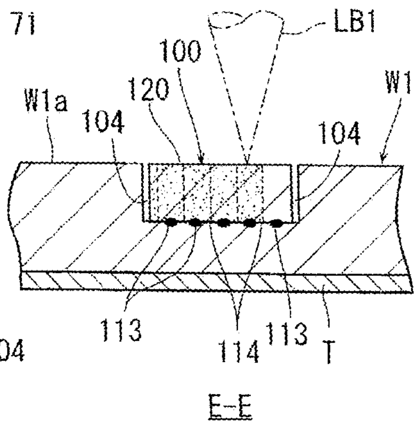
FIG. 9C is a partial enlarged cross-sectional view illustrating the horny layer formed by the mode illustrated in FIG. 9B.

Then, as illustrated in FIG. 9C, the horny layer 120 is formed in the planned processing region 100 sandwiched between the laser-processed grooves 104, by applying the first laser beam LB1 and actuating the X-axis moving mechanism 4*a* and the Y-axis moving mechanism 4*b* described above. The thickness (depth) of the horny layer 120 is 200 μm, for example. Incidentally, as is understood from FIG. 9C, in the wafer W1 according to the first embodiment, a plurality of modified layers 113 are formed by applying the above-described fourth laser beam LB4 while positioning the condensing point of the fourth laser beam LB4 at the depth of a thickness (200 μm) by which the horny layer 120 is to be formed from the top surface W1*a* of the wafer W1 within the planned processing region 100. Cracks 114 extending in the surface direction of the wafer W1 (horizontal direction) are thereby formed.

In performing the horny layer forming step described above, a reflection suppressing film formed by a solution in which a water-soluble resin, an organic solvent, and an absorbing agent that absorbs the laser beam are at least mixed with each other may be formed on the top surface W1*a* of the wafer W1 in advance. The water-soluble resin is, for example, selected from either polyvinylpyrrolidone, polyvinyl alcohol, polyethylene glycol, polyethylene oxide, methyl cellulose, ethyl cellulose, hydroxypropyl cellulose, polyacrylic acid, poly-N-vinylacetamide, or polyglycerin. In addition, the organic solvent is an organic compound for dissolving such a substance as an ultraviolet absorbing agent. The organic solvent is, for example, selected from either alkylene glycol monoalkyl ether, alkylene glycol, or alkylene glycol monoalkyl ether acetate. Propylene glycol monomethyl ether is cited as an example of alkylene glycol monoalkyl ether.

Further, the absorbing agent is, for example, selected from cinnamic acid derivatives. Ferulic acid (that is, 4-hydroxy-3-methoxy cinnamic acid) is cited as an example of a cinnamic acid derivative. However, the cinnamic acid derivative may be isoferulic acid, caffeic acid, sinapinic acid, or chlorogenic acid. When the reflection suppressing film described above is formed on the top surface W1*a* in advance, a reflection loss at a time of the application of the first laser beam LB1 can be suppressed, and therefore, the horny layer 120 can be formed efficiently. In addition, this reflection suppressing film may be formed before the boundary processing step is performed. Since this reflection suppressing film includes the water-soluble resin, the reflection suppressing film can be removed easily by jetting pure water at a time of the removal.

(Peeling Step)

After the horny layer forming step described above is performed, the peeling step of peeling off the horny layer 120 from the wafer W1 is performed. The horny layer 120 formed by the horny layer forming step described above is formed in a state of being easily peeled off. The peeling step of peeling off and removing the horny layer 120 is performed by an appropriate method. For example, the horny layer 120 formed in the planned processing region 100 can be peeled off and removed by positioning a distal end of an unillustrated air nozzle at the planned dividing line L in which the horny layer 120 is formed in the wafer W1 and jetting high pressure air from the air nozzle to the horny layer 120. In addition, the method for peeling off the horny layer 120 is not limited to this. For example, the horny layer 120 can be peeled off by jetting high pressure water to the horny layer 120, or the horny layer 120 can be removed by affixing a tape having an adhesive quality to the top surface W1*a* and peeling off the tape. Further, since the horny layer 120 is set in a state of being easily peeled off by performing the horny layer forming step described above, the peeling of the horny layer 120 may progress at the same time as the horny layer forming step is performed. That is, the peeling step according to the present invention also includes a case where the horny layer 120 is simultaneously peeled off and removed by performing the horny layer forming step. In a case where only an end portion of the horny layer 120 is coupled to the substrate even though the peeling has progressed, the end portion may be removed by irradiating the end portion with the laser beam having a wavelength absorbable by the wafer W1 and thereby performing ablation processing, and consequently the horny layer 120 may be peeled off completely. The workpiece processing method according to the present invention is completed when the peeling step is completed.

As described above, the processing method described on the basis of the first embodiment includes the boundary processing step of processing a boundary 102 dividing a planned processing region 100 and another region (region in which a device is formed) from each other, and performs the correlation threshold value generating step, the energy and pulse interval setting step, the horny layer forming step, and the peeling step. The horny layer 120 that is easily peeled off can therefore be formed in the planned processing region 100 set in advance, while the occurrence of debris is suppressed. Further, the horny layer 120 to be peeled off in the peeling step is regulated by the laser-processed grooves 104 (or the cracks 112 or 114) formed by the boundary processing step. Thus, the peeling of the horny layer 120 does not extend to the outside of the planned processing region 100. It therefore becomes possible to precisely control the region to be peeled off, thus solving a problem in that the peeling extends to a region in which a device is formed.

Incidentally, in the correlation threshold value generating step and the energy and pulse interval setting step described above, definitions are made assuming that the beam area (spot diameter) of the first laser beam LB1 is fixed. However, even with the same pulse energy Pe, the formation of the horny layer 120 is affected when the beam area (spot diameter) is changed. Hence, the correlation threshold value may be set using the pulse energy per beam area (spot diameter) (Pe [J]/beam area [cm]), that is, what is generally called the fluence. However, as described above, the fluence and the pulse energy Pe are in proportional relation to each other. Thus, setting the correlation threshold value on the basis of the fluence in place of the pulse energy Pe is equivalent to setting the correlation threshold value on the basis of the pulse energy Pe.

Second Embodiment

Figure 10A:
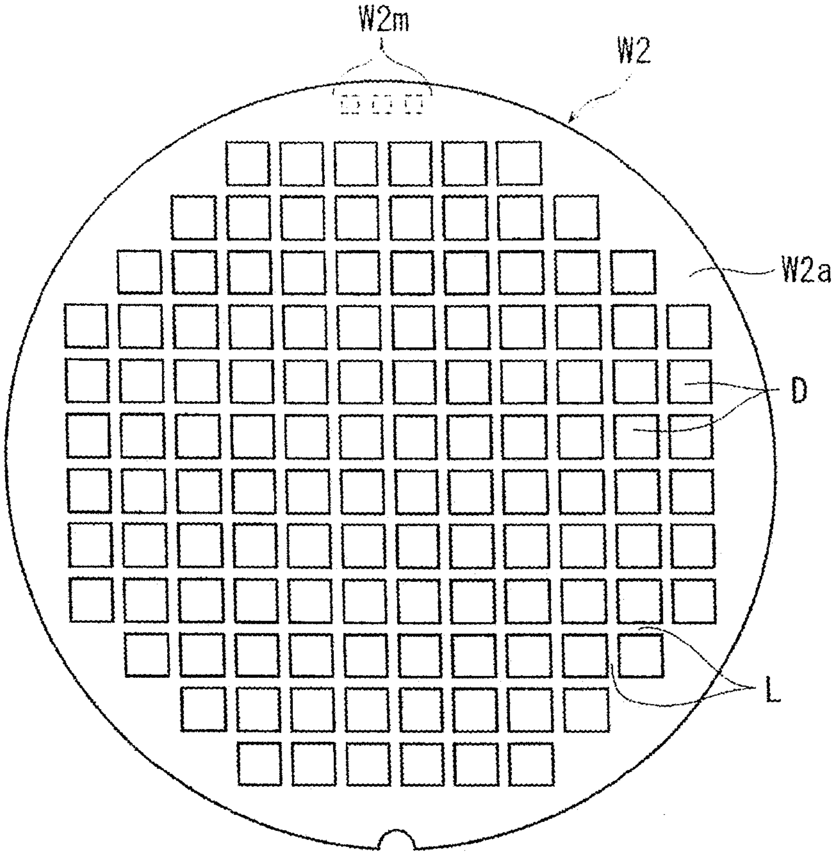
FIG. 10A is a plan view of a wafer to be processed in a second embodiment of the present invention.
Figure 10B:
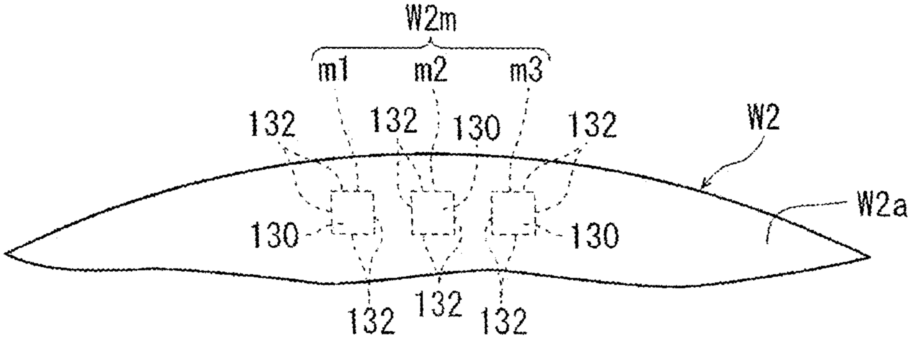
FIG. 10B is an enlarged plan view illustrating a region to be subjected to a processing method according to the present invention in the wafer illustrated in FIG. 10A.

The present invention is not limited to the case of forming a groove as a starting point of division by a horny layer along a planned dividing line L of the wafer W1 as in the first embodiment described above. With reference to FIGS. 10A and 10B, description will be made of a second embodiment in which recessed portions as local markings are formed in a workpiece by applying the present invention.

FIG. 10A illustrates a wafer W2 as a workpiece in the second embodiment. The wafer W2 is a Si wafer similar to the wafer W1 in the first embodiment described above, and processing that forms recess-shaped markings W2*m* indicating a serial code of the wafer W2, processing conditions at a time of processing the wafer W2, and the like is performed on a surplus region on an outer circumference side where no devices D are formed on the wafer W2. Incidentally, though not illustrated, as with the wafer W1 described above, the wafer W2 is also subjected to processing in a state in which the wafer W2 is supported by an annular frame F via an adhesive tape T. In addition, the markings W2*m* in the second embodiment illustrated in FIG. 10A are all illustrated in a quadrangular shape for the convenience of description. In actuality, however, characters, numbers, symbols, or the like are formed in a recessed shape.

The processing for the markings W2*m* will be described with reference to FIG. 10B, in which a region where the markings W2*m* in FIG. 10A are formed is enlarged. The markings W2*m* illustrated in the figure are constituted by three symbols m1 to m3 (indicated by broken lines). As with the first embodiment described above, a processing method according to the second embodiment also includes a setting step, a boundary processing step, a correlation threshold value generating step, an energy and pulse interval setting step, a horny layer forming step, and a peeling step.

(Setting Step)

In performing the processing method according to the present embodiment, the setting step of setting a planned processing region is first performed. As indicated by broken lines in FIG. 10B, planned processing regions in the present embodiment are planned processing regions 130 constituting the symbols m1 to m3, and are set as regions enclosed by boundaries 132 dividing the planned processing regions 130. After the positions of the planned processing regions 130 on the wafer W2 are set, positional information related to the planned processing regions 130 is stored in the controller 9 of the laser processing apparatus 1.

(Boundary Processing Step)

Performed is the boundary processing step of processing a boundary 132 dividing a planned processing region 130 and another region from each other, on the basis of the positional information related to the planned processing region 130 set by the setting step described above.

In performing the boundary processing step, first, the wafer W2 is mounted on the chuck table 35 of the laser processing apparatus 1, the wafer W2 is sucked by the unillustrated suction means being actuated and thereby a negative pressure being generated in the suction chuck, and the frame (not illustrated) supporting the wafer W2 is gripped and held by the clamps 37.

Next, the wafer W2 is moved to a position directly below the alignment unit 6 such that the top surface of the wafer W2 is imaged, and the coordinate positions of the planned processing regions 130 of the symbols m1 to m3 constituting the marking W2*m* and the boundaries 132 in the laser processing apparatus 1 are detected. After the coordinate positions of the planned processing regions 130 and the boundaries 132 are detected, the positional information is stored in the controller 9 of the laser processing apparatus 1.

On the basis of the coordinate positional information related to the boundaries 132 detected by the alignment unit 6 described above, the moving mechanism 4 described above is actuated to position the condenser 71 of the laser beam irradiating unit 7 above a boundary 132 in a predetermined direction. Next, according to the laser processing conditions 1 described above, the condensing point of the second laser beam LB2 is positioned at the boundary 132 dividing the planned processing region 130 of the wafer W2, the second laser beam LB2 is applied to the wafer W2, and the X-axis moving mechanism 4*a* and the Y-axis moving mechanism 4*b* described above as well as the rotational driving unit for rotating the chuck table 35 are actuated to processing-feed the wafer W2 held on the chuck table 35, in the X-axis direction and the Y-axis direction. As a result, a laser-processed groove 104 described on the basis of the first embodiment is formed by performing laser processing along the boundary 132 surrounding the planned processing region 130 (a processing method for forming the laser-processed groove 104 is similar to the processing method for the grooves formed in the first embodiment described above, and therefore, details thereof will be omitted).

Incidentally, the processing on the boundary 132 described above is not limited to forming the laser-processed groove 104 as in the first embodiment, and may position the condensing point of the third laser beam LB3 having a wavelength transmissible through the wafer W2 in an internal part corresponding to the boundary 132 and apply the third laser beam LB3 to the wafer W2 according to processing conditions as the laser processing conditions 2 described above, actuate the moving mechanism 4, thereby internally forming modified layers along the boundary 132, and form cracks in the depth direction along the boundary 132 surrounding the planned processing region 130 set to the symbols m1 to m3 of the markings W2*m*. Further, the processing method in the second embodiment irradiates the wafer W2 with the fourth laser beam LB4 having a wavelength transmissible through the wafer W2 while the condensing point of the fourth laser beam LB4 is positioned at a position that corresponds to the boundary on a side opposite to the upper surface of the wafer W2 (top surface W2*a* side) and corresponds to the depth of the planned processing region 130 in which the horny layer is to be formed from the top surface W2*a* side, according to the laser processing conditions 3 described above. The processing method in the second embodiment thereby forms cracks extending in the surface direction of the wafer W2 (horizontal direction) throughout the whole area of the planned processing region 130 described above (details are similar to those of the procedure described on the basis of the first embodiment, and will therefore be omitted).

(Correlation Threshold Value Generating Step and Energy and Pulse Interval Setting Step)

Also in the second embodiment, the correlation threshold value generating step and the energy and pulse interval setting step similar to those of the first embodiment described above are performed. Incidentally, the procedures of the correlation threshold value generating step and the energy and pulse interval setting step performed here are similar to those of the first embodiment, and therefore, detailed description thereof will be omitted.

(Horny Layer Forming Step and Peeling Step)

As described above, after the setting step, the boundary processing step, the correlation threshold value generating step, and the energy and pulse interval setting step are performed, the horny layer forming step of forming the horny layer and the peeling step are performed by irradiating the planned processing region 130 with the first laser beam LB1 from the top surface W2*a* of the wafer W2 and actuating the moving mechanism 4 (not illustrated). Incidentally, the correlation threshold value generating step in the second embodiment is performed in advance before the boundary processing step described above, and the horny layer forming step is performed following the boundary processing step described above. In addition, as in the first embodiment, it was confirmed in the laser processing experiment in the correlation threshold value generating step that the thickness of the horny layer and the depth of the interface were stably formed by setting the pulse width of the first laser beam LB1 in a range of 0.3 to 100 ps. Hence, the pulse width is set in the above-described range in laser processing in the horny layer forming step. Further, it has been confirmed that an excellent horny layer is formed in a case where the irradiation pitch of the first laser beam LB1 is 10 to 200 nm (see FIG. 6B). An adjustment is made to achieve the above-described irradiation pitch range by adjusting the processing feed speed in the X-axis direction as appropriate according to the repetition frequency of the first laser beam LB1. The laser processing conditions (laser processing conditions 4) based on the pulse energy Pe and the pulse interval Pw set on the basis of the energy and pulse interval setting step are thus set, the horny layer is formed in the planned processing region 130 surrounded by the boundary 132, and the peeling step is performed. The horny layer forming step and the peeling step performed here are also performed by procedures similar to those of the first embodiment described above, and therefore, detailed description thereof will be omitted.

The processing method described on the basis of the second embodiment described above includes the boundary processing step of processing a boundary 132 dividing a planned processing region 130 and another region from each other, and performs the correlation threshold value generating step, the energy and pulse interval setting step, the horny layer forming step, and the peeling step. The horny layer that is easily peeled off can therefore be formed in the planned processing region 130 set in advance, while the occurrence of debris from the regions of the markings W2*m* is suppressed. Further, the region of the horny layer to be peeled off in the peeling step can be precisely controlled without extending off the region defined by the boundary 132 formed by the boundary processing step, and can be formed precisely even when the markings m1 to m3 are symbols, numbers, or characters. Further, when cracks are formed in advance also at a boundary as the bottom surface of the planned processing region 130 by the fourth laser beam LB4, the wafer W2 can be prevented from being peeled off to more than a desired depth in the horny layer forming step or the peeling step.

Third Embodiment

The present invention is not limited to a mode of processing a boundary dividing a planned processing region and another region from each other in the boundary processing step as in the first and second embodiments described above, and also includes a case where processing of dividing a planned processing region into a plurality of regions is performed in the boundary processing step. A third embodiment that performs the processing of dividing a planned processing region into a plurality of regions in the boundary processing step will be described in detail with reference to FIGS. 11A to 13.

Figure 11A:
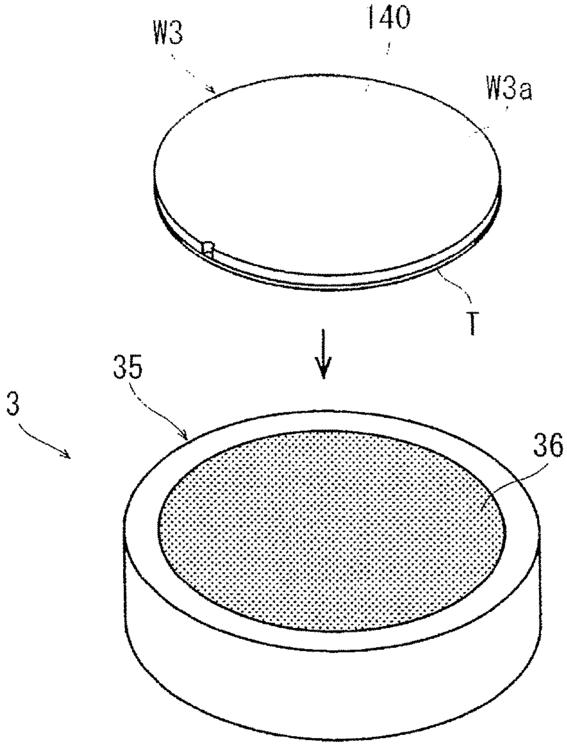
FIG. 11A is a perspective view of a wafer to be processed in a third embodiment of the present invention.

FIG. 11A represents a perspective view of a wafer W3 to be processed by a workpiece processing method configured on the basis of the present invention and the chuck table 35 of the laser processing apparatus 1, the chuck table 35 holding the wafer W3 (configuration other than that illustrated in the figure is omitted for the convenience of description). The wafer W3 is a Si wafer, and is a wafer having, for example, a diameter of 200 mm and a thickness of 700 μm. The third embodiment is an embodiment that processes the wafer W3, whose grinding processing is difficult or takes time, such that the wafer W3 can be thinned relatively easily by removing a top surface W3*a*. In the processing method to be described in the following, processing is performed on the top surface W3*a* of the Si wafer W3 illustrated in FIG. 11A. A protective tape T is affixed to an undersurface of the wafer W3 (on a side opposite to the top surface W3*a*), and is held on the chuck table 35. The processing is then performed by the processing method according to the present embodiment to be described in the following.

(Setting Step)

In performing the workpiece processing method according to the third embodiment, the setting step of setting a planned processing region is performed first. The planned processing region in the third embodiment is the whole area of the top surface W3*a* of the wafer W3 illustrated in FIG. 11A, and is indicated by reference numeral 140. After the planned processing region 140 on the wafer W3 is thus set, information regarding the planned processing region 140 (information regarding a contour surrounding the whole area of the top surface W3*a* of the wafer W3) is stored in the controller 9 of the laser processing apparatus 1.

(Boundary Processing Step)

Figure 11B:
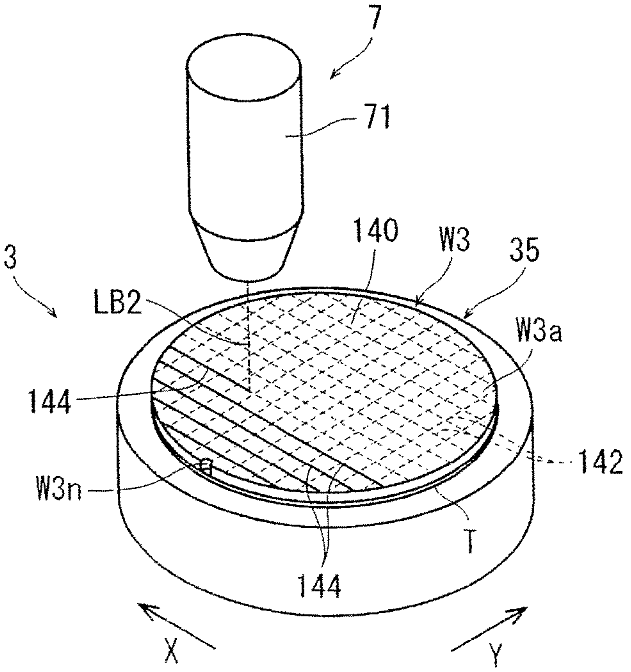
FIG. 11B is a perspective view illustrating a mode of performing the boundary processing step on the wafer illustrated in FIG. 11A.
Figure 12:
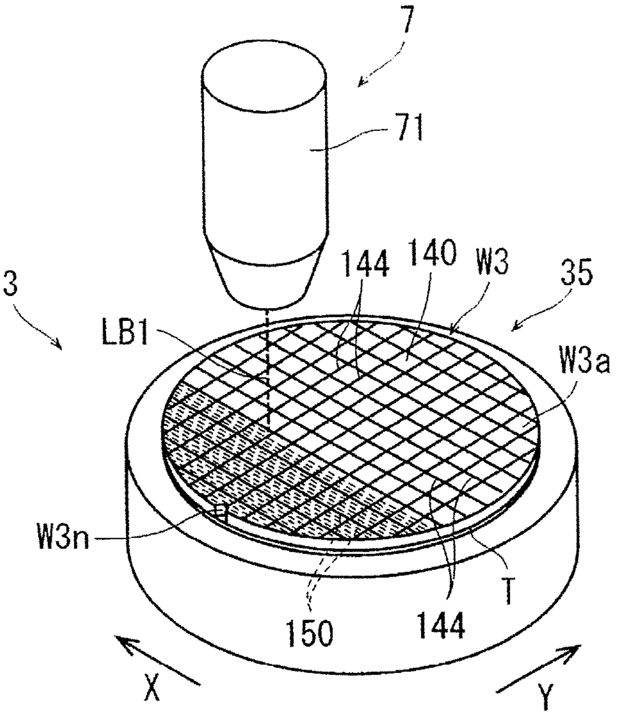
FIG. 12 is a perspective view illustrating a mode of performing the horny layer forming step on the wafer illustrated in FIGS. 11A and 11B.

The boundary processing step in the third embodiment processes boundaries that divide the planned processing region 140 set on the wafer W3 into a plurality of regions. A method of setting the boundaries is not particularly limitative. However, for example, linear boundaries 142 are preferably set in a direction (that is, the X-axis direction indicated by an arrow X in FIG. 11B) orthogonal to a direction (the Y-axis direction indicated by an arrow Y in FIG. 11B; see also FIG. 12) in which the processing region at a time of forming the horny layer expands when the horny layer is formed in the horny layer forming step to be described later. In the third embodiment, the direction in which the processing region that forms the horny layer in the horny layer forming step expands is a direction orthogonal to a direction of going from a notch W3*n* indicating a crystal orientation to the center of the wafer W3, as illustrated in FIG. 12. Hence, as illustrated in FIG. 11B, the boundaries 142 in the third embodiment are set by a plurality of boundaries 142 set in such a manner as to be along the direction of going from the notch W3*n* to the center of the wafer W3 and a plurality of boundaries 142 set in such a manner as to be along the direction orthogonal to the direction of going from the notch W3*n* to the center of the wafer W3. A lattice shape is formed by the pluralities of boundaries 142.

As in the first embodiment, the boundaries 142 described above are irradiated with the second laser beam LB2 according to the laser processing conditions 1, and the X-axis moving mechanism 4*a*, the Y-axis moving mechanism 4*b*, and the rotational driving unit for rotationally driving the chuck table 35 are actuated, thereby forming laser-processed grooves 144 similar to the laser-processed grooves 104 described above. It is to be noted that, as in the first and second embodiments described above, the processing on the boundaries 142 is not limited to forming the laser-processed grooves 144 similar to the above-described laser-processed grooves 104 by applying the second laser beam LB2, and may form modified layers and cracks by positioning the condensing point of the third laser beam LB3 having a wavelength transmissible through the wafer W3 in internal parts corresponding to the boundaries 142 and applying the third laser beam LB3 to the wafer W3 according to the laser processing conditions 2, or form cut grooves by a cutting unit including a cutting blade held in such a manner as to be rotatable. Further, the cracks extending in the surface direction of the wafer W3 may be formed by irradiating the wafer W3 with the fourth laser beam LB4 having a wavelength transmissible through the wafer W3 while positioning the condensing point of the fourth laser beam LB4 at a depth corresponding to a thickness by which the horny layer is to be formed from the top surface W3*a* (one surface) of the wafer W3.

(Correlation Threshold Value Generating Step and Energy and Pulse Interval Setting Step)

Also in the third embodiment, a correlation threshold value generating step and an energy and pulse interval setting step similar to those of the first and second embodiments described above are performed. Incidentally, the procedures of the correlation threshold value generating step and the energy and pulse interval setting step performed here are similar to those of the first embodiment, and therefore, detailed description thereof will be omitted.

(Horny Layer Forming Step and Peeling Step)

After the setting step, the boundary processing step, and the energy and pulse interval setting step described above are performed, the horny layer forming step of forming a horny layer 150 by irradiating the whole area of the top surface W3*a* of the wafer W3 (planned processing region 140) with the first laser beam LB1 according to the laser processing conditions 4 set on the basis of the energy and pulse interval setting step is performed, as illustrated in FIG. 12. At this time, the first laser beam LB1 starts to be applied from a processing start point at which the notch W3*n* is formed. The horny layer 150 is formed by scanning with the first laser beam LB1 in a direction (X-axis direction) orthogonal to the direction of going from the notch W3*n* to the center of the wafer W3, and the wafer W3 held on the chuck table 35 is indexing-fed at predetermined intervals (for example, 15 μm) in the Y-axis direction. Then, ultimately, the horny layer 150 is formed in the whole area of the top surface W3*a* of the wafer W3. The thickness of the horny layer 150 formed at this time is 200 μm, for example. The laser processing conditions 4 implemented by the horny layer forming step are similar to those of the processing described in the first and second embodiments described above, and therefore, detailed description thereof will be omitted. Incidentally, the order of positions at which the horny layer 150 is formed by applying the first laser beam LB1 is not limited to this. For example, there may be adopted an order in which the horny layer 150 is formed in the entire surface of one region demarcated by processed grooves formed in the boundary processing step and thereafter the horny layer 150 is formed in the entire surface of a region that is adjacent in the X-direction and that is demarcated by processed grooves formed in the boundary processing step.

The peeling step is performed after the horny layer forming step described above or at the same time as the horny layer forming step. This peeling step includes not only a method of peeling off and removing the top surface W3*a* in which the horny layer 150 is formed by grinding the top surface W3*a* by an unillustrated well-known grinding apparatus but also a method of removing the top surface W3*a* of the wafer W3 by polishing the top surface W3*a* by a polishing apparatus, a method of peeling off and removing the horny layer 150 by jetting high pressure air or high pressure water to the top surface W3*a* of the wafer W3, and the like. The peeling step further includes a case where, when the horny layer forming step of forming the horny layer 150 is performed, the horny layer 150 is peeled off and detached from the top surface W3*a* of the wafer W3 at the same time and is thus removed from the top surface W3*a*.

According to the processing method illustrated in the third embodiment described above, the horny layer that is easily peeled off can be formed in the planned processing region 140 while the occurrence of debris is suppressed. Further, the horny layer 150 to be peeled off in the peeling step is regulated by the processed grooves or the cracks formed by the boundary processing step. Thus, the peeling of the horny layer 150 is controlled, and it becomes possible to precisely control the region to be peeled off, thereby solving a problem of the peeling extending to the region not desired to be peeled off and hindering the formation of the horny layer 150 during the formation of the horny layer 150.

Figure 13:
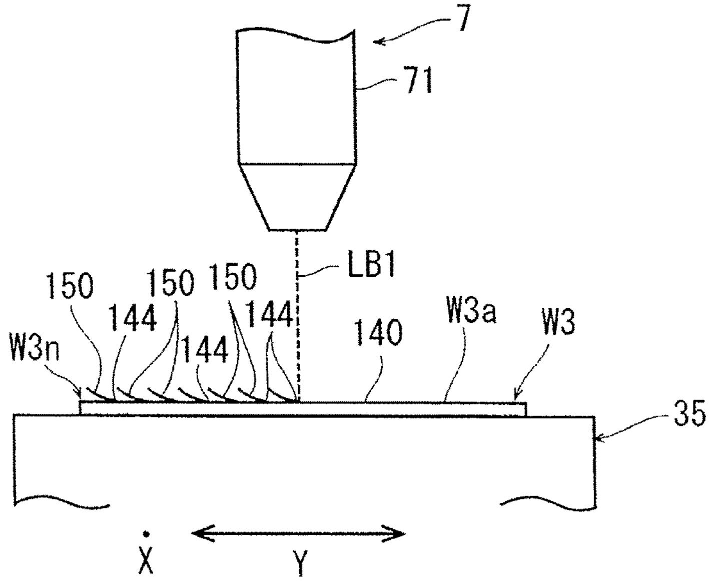
FIG. 13 is a side view illustrating a mode in which a top surface is peeled off by performing the horny layer forming step illustrated in FIG. 12.

In particular, in the third embodiment, processing is performed by the boundary processing step described above after a plurality of boundaries 142 are set in the direction orthogonal to the direction (Y-axis direction in FIG. 12) in which the processing region where the horny layer 150 is formed expands, that is, the direction (X-axis direction in FIG. 12) orthogonal to the direction of going from the notch W3*n* to the center of the wafer W3, in the boundary processing step. Consequently, as illustrated in FIG. 13, even in a case where the horny layer 150 is formed in the horny layer forming step described above and the horny layer 150 is peeled off as the peeling step progresses at the same time, the peeling of the horny layer 150 is regulated by the laser-processed grooves 144 formed at the boundaries 142 described above, thereby avoiding a problem in which the peeling extends to an unintended region, that is, a region in which the horny layer 150 is to be formed hereafter, and thus an excellent horny layer 150 is not formed. Further, a problem in which the peeled-off horny layer 150 is turned up, covers an upper side of a region in which the horny layer is desired to be formed hereafter, blocks the first laser beam LB1, and thus an excellent horny layer is not formed is avoided.

Fourth Embodiment

Figure 14:
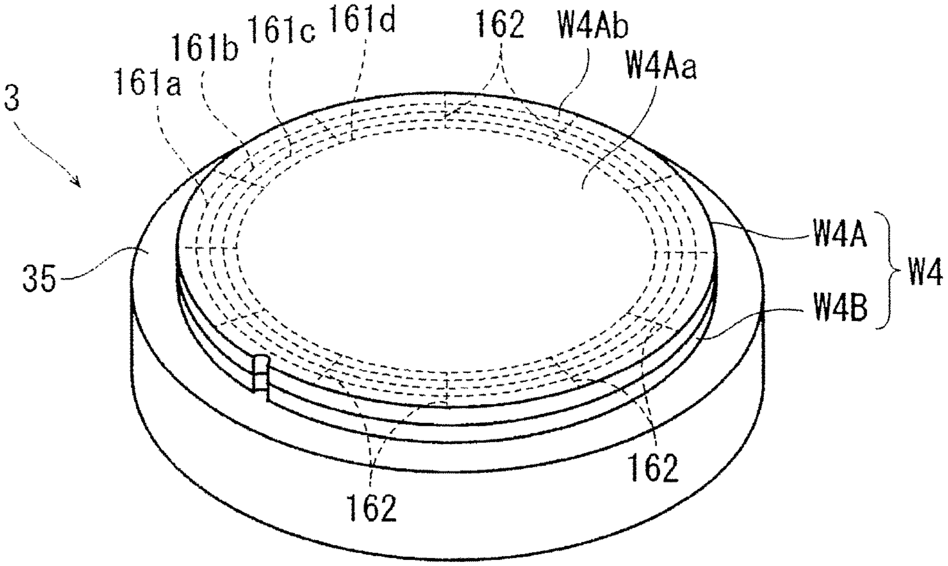
FIG. 14 is a perspective view of a laminated wafer to be processed in a fourth embodiment and a fifth embodiment of the present invention.

The present invention is not limited to the modes of the processing method illustrated in the first to third embodiments described above, and may be, for example, a processing method according to a fourth embodiment to be described in the following. FIG. 14 represents a perspective view of a wafer W4 to be processed by the fourth embodiment. The wafer W4 is held on the chuck table 35 of the laser processing apparatus 1, the chuck table 35 holding the wafer W4 (configuration other than that illustrated in the figure, including the clamps 37, is omitted for the convenience of description). The wafer W4 is a laminated wafer obtained by laminating together a first wafer W4A and a second wafer W4B, which are each a Si wafer, and coupling the first wafer W4A and the second wafer W4B to each other via an oxide film. The fourth embodiment performs processing of peeling off and removing a periphery of the first wafer W4A of the wafer W4 illustrated in FIG. 14 (what is generally called edge trimming). The fourth embodiment is implemented by the following procedure.

(Setting Step)

In performing the processing method according to the present embodiment, the setting step of setting a planned processing region is performed first. The planned processing region in the present embodiment is an annular planned processing region W4Ab surrounding a central region W4Aa which is part of the first wafer W4A that forms the upper surface of the wafer W4 illustrated in FIG. 14 and in which the horny layer is not formed by the horny layer forming step to be described later. The central region W4Aa and the planned processing region W4Ab are divided from each other by an annular boundary 161*d*. After the planned processing region W4Ab on the wafer W4 is thus set, positional information related to the planned processing region W4Ab is stored in the controller 9 of the laser processing apparatus 1.

(Boundary Processing Step)

Boundaries that divide the planned processing region W4A into a plurality of regions and the boundary that divides the planned processing region W4Ab and the other region (central region W4Aa described above) from each other are set on the basis of the positional information related to the planned processing region W4Ab set by the setting step described above. The boundary processing step of processing the boundaries is then performed. As the boundaries in the fourth embodiment, as illustrated in FIG. 14, for example, a plurality of concentric boundaries 161*a*, 161*b*, 161*c*, and 161*d* having different diameters are set at equal intervals on the annular planned processing region W4Ab from an outer circumferential edge side, and further, a plurality of radial boundaries 162 that divide the planned processing region W4Ab into a plurality of regions are set on the planned processing region W4Ab. It is to be noted that, while the boundaries 162 illustrated in the figure are set at equal intervals of 30° on the periphery of the first wafer W4A, the present invention is not limited to this, and the boundaries 162 may be set at intervals of 60° or intervals of 90°, for example, or a single annular boundary 161*d*, for example, may be set.

The annular boundaries 161*a*, 161*b*, and 161*c* and the plurality of radial boundaries 162 are boundaries for dividing the planned processing region W4Ab into a plurality of region. The annular boundary 161*d* is a boundary for dividing the planned processing region W4Ab from the central region W4Aa in which the horny layer is not formed. Incidentally, while each of the boundaries described above is indicated by a broken line in FIG. 14 for the convenience of description, each of the boundaries is not depicted on an actual wafer W4A. Positional information related to each of the boundaries is stored in the controller 9 of the laser processing apparatus 1. Incidentally, a width at which the planned processing region W4Ab is set on the first wafer W4A is a width of approximately 0.5 to 20 mm. In FIG. 14, the width of the planned processing region W4Ab is depicted in an exaggerated manner for the convenience of description.

Figure 15A:
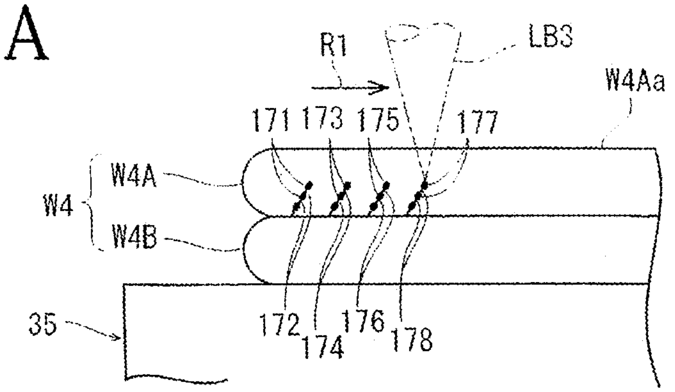
FIGS. 15A to 15C are side views illustrating, partly in cross-section, modes of the boundary processing step and the horny layer forming step performed on the laminated wafer illustrated in FIG. 14.

After each of the boundaries is set as described above, the wafer W4 is imaged by the alignment unit 6 of the laser processing apparatus 1 illustrated in FIG. 1A, and the coordinate positions of each of the boundaries to be processed in the laser processing apparatus 1 are detected and stored in the controller 9. Next, the moving mechanism 4 described above is actuated to position the condenser 71 of the laser beam irradiating unit 7 above the wafer W4, and position the condensing point of the third laser beam LB3 having a wavelength transmissible through the first wafer W4A at a deepest side (second wafer W4B side) of an internal part corresponding to the boundary 161*a* and apply the third laser beam LB3 to the first wafer W4A according to the laser processing conditions 2 described above, and the chuck table 35 is rotated by the unillustrated rotational driving unit being actuated. Consequently, as illustrated in FIG. 15A, an annular modified layer 171 is formed within the first wafer W4A along a position corresponding to the boundary 161*a* described above. In the fourth embodiment, a plurality of modified layers 171 (three modified layers 171 in the fourth embodiment illustrated in the figure) are formed by gradually raising the condensing point of the third laser beam LB3 in order to form the modified layers 171 described above at a plurality of different depth positions in the internal part corresponding to the boundary 161*a*, and moving the condensing point of the third laser beam LB3 to the central side of the wafer W4 (in a direction indicated by an arrow R1 in the figure). As a result, as is understood from FIG. 15A, cracks 172 that couple the modified layers 171 to one another are in a mode of being inclined toward the inside of the first wafer W4A (direction indicated by the arrow R1). Incidentally, in the embodiment illustrated in the figures, the modified layers 171 are formed on a deep side, and the cracks 172 are formed in a state of reaching the lower surface side of the first wafer W4A but not reaching the top surface side thereof.

After the modified layers 171 and the cracks 172 are formed in the internal part corresponding to the annular boundary 161*a* as described above, a procedure similar to the above is performed to thereby form a plurality of modified layers 173 and cracks 174 in an internal part at a position corresponding to the boundary 161*b*, a plurality of modified layers 175 and cracks 176 in an internal part at a position corresponding to the boundary 161*c*, and a plurality of modified layers 177 and cracks 178 in an internal part at a position corresponding to the boundary 161*d*. As with the cracks 172 described above, the cracks 174, 176, and 178 are formed in a mode of being inclined toward the inside of the first wafer W4A.

Next, though not illustrated, internal parts corresponding to the radial boundaries 162 described above are also irradiated with the third laser beam LB3 according to the laser processing conditions 2 described above, and the moving mechanism 4 and the rotational driving unit of the chuck table 35 are actuated, so that a plurality of modified layers and cracks are formed along the boundaries 162. Incidentally, at a time of forming the modified layers and the cracks in the internal parts corresponding to the radial boundaries 162, the modified layers are formed radially while the position at which the condensing point is positioned is moved vertically upward. The cracks formed by the modified layers are thereby formed in a vertical direction. The boundary processing step in the present fourth embodiment is thereby completed. Incidentally, the processing in the boundary processing step on the radial boundaries 162 described above may be performed before the processing in the boundary processing step on the annular boundaries 161*a* to 161*d* described above is performed.

(Correlation Threshold Value Generating Step and Energy and Pulse Interval Setting Step)

Also in the fourth embodiment, the correlation threshold value generating step and the energy and pulse interval setting step similar to those of the first to third embodiments described above are performed. The procedures of the correlation threshold value generating step and the energy and pulse interval setting step performed here are similar to those of the first embodiment described above, and therefore, detailed description thereof will be omitted. However, the procedures of the correlation threshold value generating step and the energy and pulse interval setting step are preferably performed in advance before the processing of the boundary processing step described above is performed.

(Horny Layer Forming Step and Peeling Step)

Figure 15B:
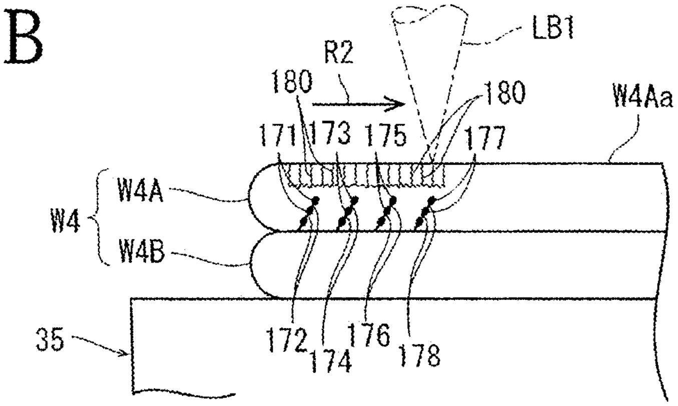

After the setting step, the boundary processing step, and the energy and pulse interval setting step described above are performed, performed is the horny layer forming step of forming a horny layer 180 in the top surface of the first wafer W4A, as illustrated in FIG. 15B, by irradiating the planned processing region W4Ab of the first wafer W4A with the first laser beam LB1 according to processing conditions set on the basis of the energy and pulse interval setting step (laser processing conditions 4). At this time, the application of the first laser beam LB1 is started at the outer circumferential edge side of the first wafer W4A, and the condensing point of the first laser beam LB1 is gradually moved as indicated by an arrow R2 in the figure, by the moving mechanism 4 and the rotational driving unit of the chuck table 35 described above being actuated. The whole area of the annular region is thus scanned with the first laser beam LB1 from the outer circumferential edge of the first wafer W4A to the boundary 161*d* described above, and the horny layer 180 is thereby formed. The thickness of the horny layer 180 formed at this time is 200 μm, for example.

Figure 15C:
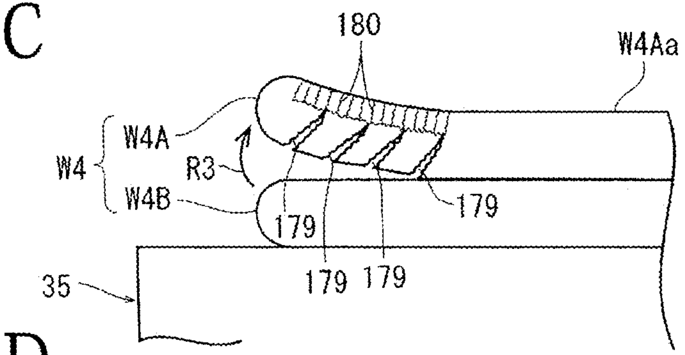
Figure 15D:
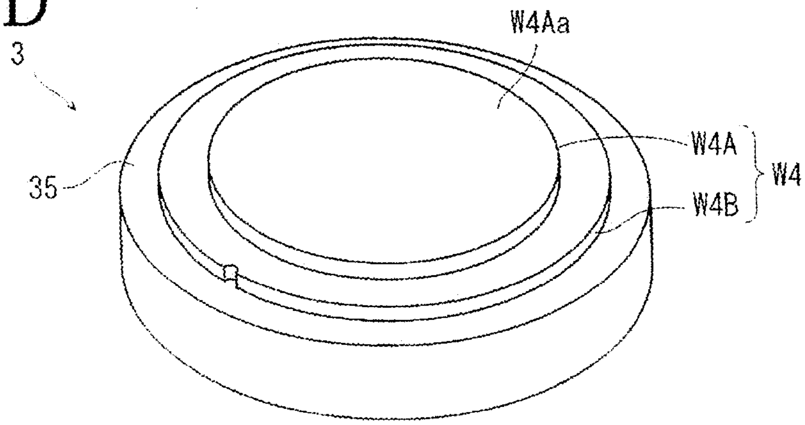
FIG. 15D is a perspective view of the laminated wafer in a state in which the periphery of a first wafer is removed.

As a result of forming the horny layer 180 in the whole area of the planned processing region W4Ab by performing the horny layer forming step described above, a stress acts on the affixed surfaces of the first wafer W4A and the second wafer W4B in the region in which the horny layer 180 is formed, so that, as indicated by an arrow R3 in FIG. 15C, the peeling step in which the first wafer W4A is peeled off from the second wafer W4B progresses. In the planned processing region W4Ab in which the horny layer 180 is formed, a fracture portion 179 is formed with each crack (including each of the cracks formed to correspond to the boundaries 162 described above) as a starting point. The first wafer W4A is thereby peeled off from the second wafer W4B. Incidentally, in a case where the planned processing region W4Ab in which the horny layer 180 is formed is not completely removed from the second wafer W4B of being in a state illustrated in FIG. 15C, the planned processing region W4Ab can be removed completely by jetting such fluid as high pressure air or high pressure water to an upper surface of an outer circumferential region of the first wafer W4A or the laminated surface of the first wafer W4A laminated to the second wafer W4B, or performing well-known grinding processing or polishing processing. As illustrated in FIG. 15D, a desired form can be obtained with the periphery of the first wafer W4A removed (edge trimming) by performing the horny layer forming step and the peeling step described above.

It is to be noted that, while the modified layers and the cracks are formed with use of the third laser beam LB3 in the processing on the boundaries 161*a* to 161*d* and 162 by the boundary processing step in the fourth embodiment described above, the present invention is not limited to this. For example, it is also possible to form laser-processed grooves by irradiating the boundaries 161*a* to 161*d* and 162 described above with the second laser beam LB2 according to the laser processing conditions 1, form the modified layers and the cracks along a direction perpendicular to the substrate surface by applying the third laser beam LB3, or form cut grooves with use of a cutting unit having a rotatable cutting blade. Further, each of the boundaries 161*a* to 161*d* and the boundaries 162 may be processed by combining the second laser beam LB2, the third laser beam LB3, and the cutting unit including the rotatable cutting blade. For example, in the boundary processing step on the annular boundaries 161*a* to 161*d*, modified layers and cracks may be formed by the third laser beam LB3, and in the boundary processing step on the radial boundaries 162, laser-processed grooves may be formed with use of the second laser beam LB2 described above, or cut processed grooves may be formed by the cutting unit including the rotatable cutting blade.

According to the processing method illustrated in the fourth embodiment described above, the horny layer 180 that facilitates the peeling of the planned processing region W4Ab can be formed, while the occurrence of debris is suppressed. Further, the horny layer 180 to be peeled off in the peeling step is regulated by cracks (or grooves) formed by the boundary processing step. Thus, it becomes possible to precisely control the region in which the horny layer 180 is to be peeled off, thereby solving a problem of the peeling extending to the region not desired to be peeled off, for example, the central region W4Aa. In particular, in the fourth embodiment, the plurality of annular modified layers 171, 173, 175, and 177 are formed on the deep side of the first wafer W4A by the third laser beam LB3, and the inclined-shaped cracks 172, 174, 176, and 178 are formed on the deep side of the first wafer W4A. Thus, the peeling of the planned processing region W4Ab set on the outer circumferential side of the first wafer W4A is controlled excellently and precisely, and easy removal of the periphery of the first wafer W4A (edge trimming) is realized.

Fifth Embodiment

The processing method for performing the processing of, on the basis of the present invention, peeling off and removing the periphery of the wafer W4 (laminated wafer obtained by laminating together the first wafer W4A and the second wafer W4B and coupling the first wafer W4A and the second wafer W4B to each other via the oxide film) illustrated in FIG. 14 (what is generally called edge trimming) is not limited to the mode of the processing method described on the basis of the fourth embodiment described above, and may be performed by a processing method according to a fifth embodiment to be described in the following.

(Setting Step)

The setting step in the fifth embodiment is performed by a procedure similar to that of the setting step in the fourth embodiment described above (detailed description thereof will be omitted).

(Correlation Threshold Value Generating Step and Energy and Pulse Interval Setting Step)

Also in the fifth embodiment, the correlation threshold value generating step and the energy and pulse interval setting step similar to those of the first to fourth embodiments described above are performed. Incidentally, the procedures of the correlation threshold value generating step and the energy and pulse interval setting step performed here are similar to those of the first embodiment described above, and therefore, detailed description thereof will be omitted.

(Boundary Processing Step, Horny Layer Forming Step, and Peeling Step)

As in the fourth embodiment described above, the boundaries that divide the planned processing region W4Ab into a plurality of regions and the boundary that divides the planned processing region W4Ab and the other region (central region W4Aa described above) from each other are set on the basis of the positional information related to the planned processing region W4Ab set by the setting step. Also as the boundaries in the fifth embodiment, as described with reference to FIG. 14, the concentric boundaries 161*a*, 161*b*, 161*c*, and 161*d* having different diameters are set at equal intervals from an outer circumferential edge side on the annular planned processing region W4Ab surrounding the central region W4Aa in which the horny layer is not formed, and further, the plurality of radial boundaries 162 that divide the planned processing region W4Ab into a plurality of region are set at equal intervals of 30° on the annular planned processing region W4Ab.

The annular boundaries 161*a*, 161*b*, and 161*c* and the plurality of radial boundaries 162 are boundaries for dividing the planned processing region W4Ab into a plurality of regions. The boundary 161*d* is a boundary for dividing the planned processing region W4Ab from the central region W4Aa as the other region in which the horny layer is not formed. Positional information related to each of the boundaries is stored in the controller 9 of the laser processing apparatus 1.

In the fifth embodiment, the processing on the plurality of radial boundaries 162 that divide the planned processing region W4Ab into a plurality of regions is performed before the processing on the annular boundaries 161*a* to 161*d*. The processing on the boundaries 162 is performed by a procedure similar to that of the processing on the boundaries 162 described in the fourth embodiment described above. A plurality of modified layers and cracks are formed along the boundaries 162 (not illustrated) by positioning the condensing point of the third laser beam LB3 transmissible through the first wafer W4A in the internal parts of the boundaries 162, applying the third laser beam LB3 to the first wafer W4A, and actuating the moving mechanism 4 and the rotational driving unit of the chuck table 35. At a time of forming the modified layers and the cracks in the internal parts corresponding to the radial boundaries 162, the plurality of modified layers are formed radially while the position at which the condensing point is positioned is moved vertically upward. The cracks formed in such a manner as to couple the modified layers to each other are thereby formed in the vertical direction.

The fifth embodiment is different from the fourth embodiment in that the fifth embodiment alternately performs the processing of the boundary processing step on the annular boundaries 161*a* to 161*d* and the processing of the horny layer forming step and the peeling step. Description will be made more specifically in the following.

Figure 16A:
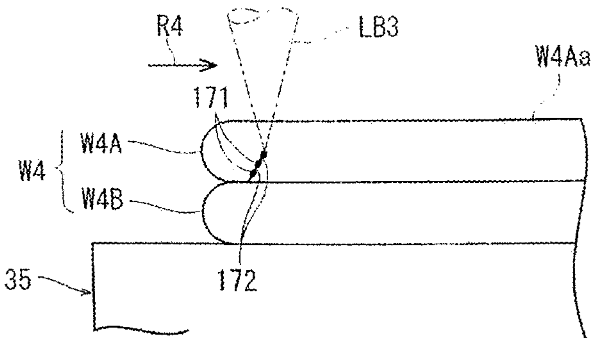
FIGS. 16A to 16E are side views illustrating, partly in cross-section, other modes of the boundary processing step and the horny layer forming step performed on the laminated wafer illustrated in FIG. 14.

After the modified layers and the cracks are formed in the internal parts corresponding to the radial boundaries 162 as described above, the condensing point of the third laser beam LB3 is positioned in an internal part at the position corresponding to the outermost circumferential boundary 161*a* set on the first wafer W4A, and the third laser beam LB3 is applied to the first wafer W4A, as illustrated in FIG. 16A, and the rotational driving unit of the chuck table 35 is actuated. A plurality of modified layers 171 (for example, three modified layers 171) are formed in an inclined shape by gradually raising the condensing point of the third laser beam LB3 in order to form the modified layers 171 described above at a plurality of different depth positions, and moving the condensing point of the third laser beam LB3 to the central side of the wafer W4 (in a direction indicated by an arrow R4). As a result, as is understood from FIG. 16A, cracks 172 that couple the modified layers 171 to one another are formed, and the cracks 172 are in a mode of being inclined toward the inside of the first wafer W4A. Incidentally, the processing that forms the modified layers 171 and the cracks 172 is the same as the processing that forms the modified layers 171 and the cracks 172 in the fourth embodiment described above.

Figure 16B:
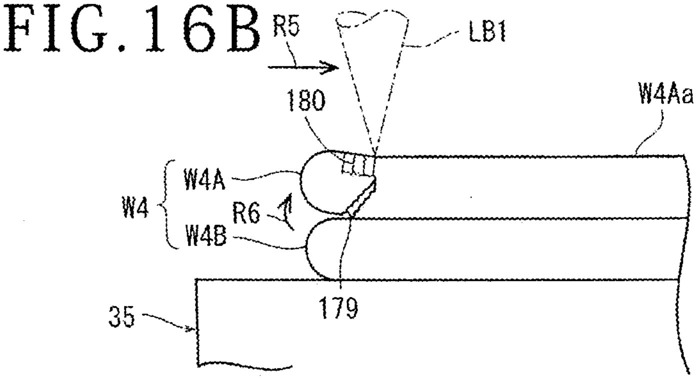

After the modified layers 171 and the cracks 172 described above are formed in the internal part at the position corresponding to the outermost circumferential boundary 161*a*, the horny layer forming step and the peeling step to be described in the following are performed. In performing the horny layer forming step, irradiation is started by positioning the condensing point of the first laser beam LB1 more to the outer circumference side than the annular boundary 161*a* (region in which the modified layers 171 and the cracks 172 are formed) in the planned processing region W4Ab on the basis of the processing conditions set on the basis of the energy and pulse interval setting step described above (for example, the laser processing conditions 4 described above), and the wafer W4 is rotated by the rotational driving unit of the chuck table 35 being actuated. As illustrated in FIG. 16B, the condensing point is gradually moved to the position corresponding to the boundary 161*a* in a direction of the central side of the wafer W4 (in a direction indicated by an arrow R5 in the figure). Thus, the horny layer forming step is partially performed, so that the horny layer 180 is formed annularly in a region from the outermost circumference of the first wafer W4A to the boundary 161*a*. The thickness of the horny layer 180 formed at this time is 200 μm, for example.

As a result of forming the horny layer 180 as described above, in the region in which the horny layer 180 is formed on the outside of the boundary 161*a*, a stress acts on the affixed surfaces of the first wafer W4A and the second wafer W4B, a fracture portion 179 is formed, and as indicated by an arrow R6 in FIG. 16B, the peeling step in which the region where the horny layer 180 is formed is partially peeled off from the second wafer W4B progresses.

Figure 16C:
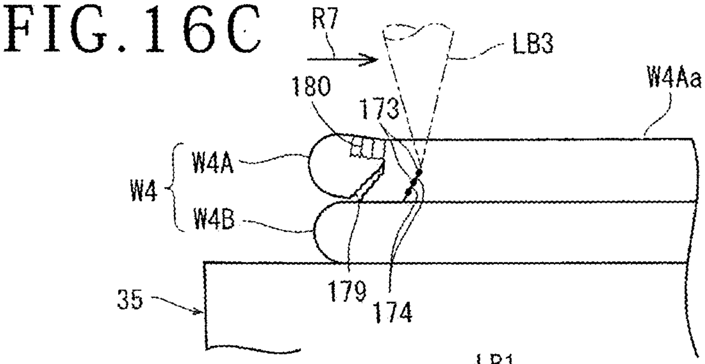

After the region corresponding to the boundary 161*a* is peeled off by performing the horny layer forming step and the peeling step as described above, the condensing point of the third laser beam LB3 is once more positioned in an internal part at a position corresponding to the boundary 161*b* set on the first wafer W4A, and the third laser beam LB3 is applied to the first wafer W4A, as illustrated in FIG. 16C, and the wafer W4 is rotated by the rotational driving unit of the chuck table 35 being actuated. Then, performed is the boundary processing step which forms a plurality of modified layers 173 (for example, three modified layers 173) in an inclined shape by gradually raising the condensing point of the third laser beam LB3 in order to form the modified layers 173 at a plurality of different depth positions, and moving the condensing point of the third laser beam LB3 to the central side of the wafer W4 (in a direction indicated by an arrow R7 in the figure). As a result, as is understood from FIG. 16C, cracks 174 that couple the modified layers 173 to one another are formed, and the cracks 174 are in a mode of being inclined toward the inside of the first wafer W4A. Incidentally, the processing that forms the modified layers 173 and the cracks 174 is the same as the processing that forms the modified layers 173 and the cracks 174 in the fourth embodiment described above.

Figure 16D:
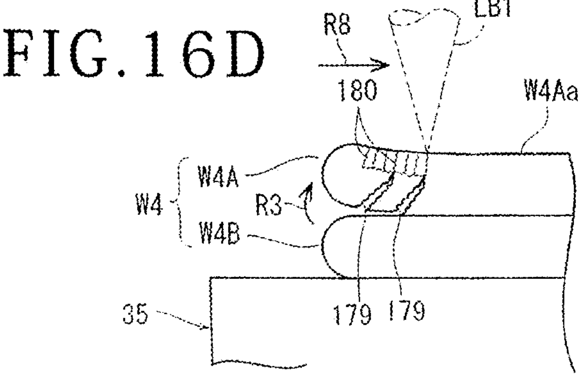

Next, as illustrated in FIG. 16D, irradiation is started by positioning the condensing point of the first laser beam LB1 in a region that is more to the outer circumference side than the region in which the modified layers 173 and the cracks 174 are formed in the planned processing region W4Ab and at a position adjacent to the region in which the horny layer 180 has been previously formed, on the basis of the processing conditions set on the basis of the energy and pulse interval setting step described above (for example, the laser processing conditions 4), the wafer W4 is rotated by the rotational driving unit of the chuck table 35 being actuated, and the condensing point is moved in a direction indicated by an arrow R8 and is moved to a position in which the modified layers 173 are formed. Thus, as illustrated in FIG. 16D, the horny layer forming step of forming the horny layer 180 in an annular shape between the boundary 161*a* and the boundary 161*b* is performed. In addition, as a result of forming the horny layer 180, also in the region in which the horny layer 180 is newly formed, a stress acts on the affixed surfaces of the first wafer W4A and the second wafer W4B, a fracture portion 179 is formed along the cracks 174, and as indicated by an arrow R3 in FIG. 16D, the first wafer W4A is peeled off from the second wafer W4B (peeling step).

Though not illustrated in the figures, following the processing described above, modified layers and cracks are formed by performing processing similar to that of the above-described boundary processing step on an internal part at a position corresponding to the boundary 161*c*, and the horny layer forming step of forming the horny layer 180 in a region sandwiched between the boundary 161*b* and the boundary 161*c* is performed. Next, modified layers and cracks are formed by performing processing similar to that of the above-described boundary processing step on an internal part at a position corresponding to the boundary 161*d*, and the horny layer forming step of forming the horny layer 180 in a region sandwiched between the boundary 161*c* and the boundary 161*d* is performed. Thus, as illustrated in FIG. 16E, fracture portions 179 are formed in the regions corresponding to the respective cracks, and in the peeling step, the whole area of a region corresponding to the planned processing region W4Ab of the first wafer W4A is peeled off from the second wafer W4B, as indicated by an arrow R3 (state similar to that of the wafer W4 illustrated in FIG. 15C is obtained).

Figure 16E:
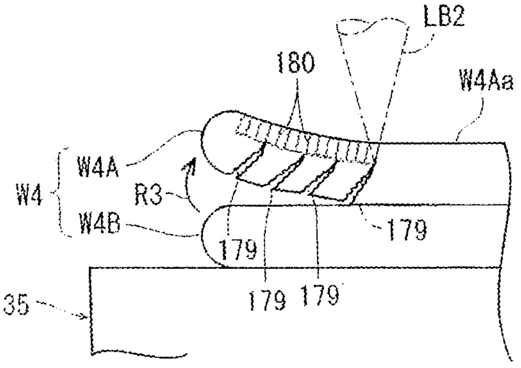

In a case where the region in which the horny layer 180 is formed (planned processing region W4Ab) is not completely removed from the first wafer W4A after the whole area of the region corresponding to the planned processing region W4Ab of the first wafer W4 is peeled off from the second wafer W4B as illustrated in FIG. 16E, the region in which the horny layer 180 is formed can be removed completely by jetting such fluid as high pressure air or high pressure water to the first wafer W4A or performing well-known grinding processing or polishing processing on the first wafer W4A as in the fourth embodiment described above. As a result, as described on the basis of FIG. 15D, a desired form can be obtained with the periphery of the first wafer W4A removed (edge trimming).

Figure 17:
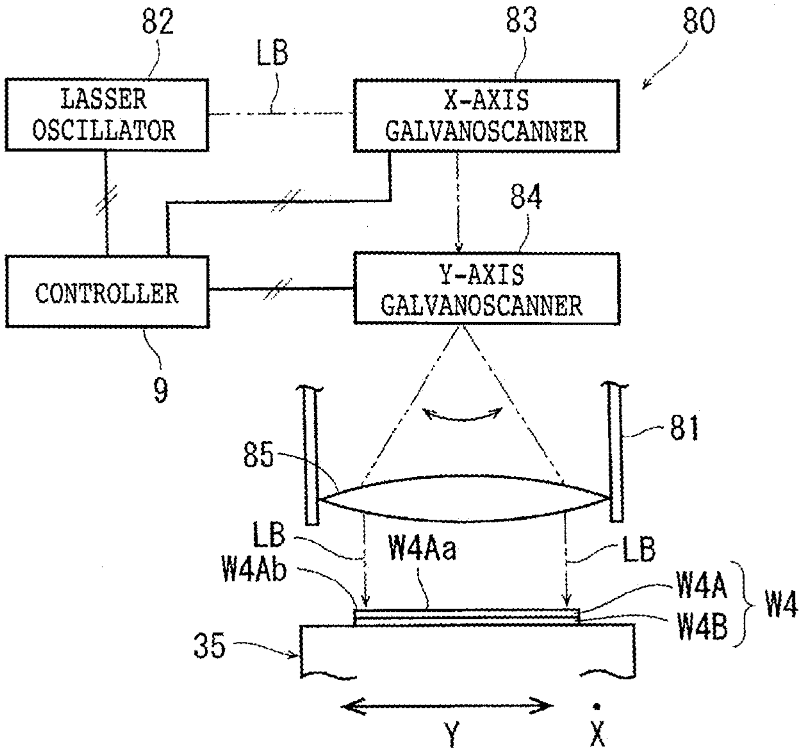
FIG. 17 is a block diagram illustrating an optical system of another form of the laser beam irradiating unit illustrated in FIG. 1B.

The laser beam irradiating unit 7 used in the present invention is not limited to the form described on the basis of FIG. 1B. For example, a laser beam irradiating unit 80 in another form illustrated in FIG. 17 may be provided in place of the laser beam irradiating unit 7 disposed in the laser processing apparatus 1 illustrated in FIG. 1B. The laser beam irradiating unit 80 illustrated in the figure includes a laser oscillator 82 that emits a pulsed laser beam LB, an X-axis galvanoscanner 83 that swings the laser beam LB emitted by the laser oscillator 82 in the X-axis direction, a Y-axis galvanoscanner 84 that swings the laser beam LB in the Y-axis direction, and a condenser 81 including an fθ lens 85 that irradiates a desired position of the wafer W4 held on the chuck table 35 with the laser beam LB swung in the X-axis direction and the Y-axis direction.

The X-axis galvanoscanner 83 and the Y-axis galvanoscanner 84 are constituted by a publicly-known configuration including a mirror not illustrated in the figure and an angle adjusting actuator that adjusts the reflection angle of the mirror. The fθ lens 85 is configured to perpendicularly irradiate the wafer W4 with the laser beam LB swung in the X-axis direction and the Y-axis direction by the action of the X-axis galvanoscanner 83 and the Y-axis galvanoscanner 84. Incidentally, the X-axis galvanoscanner 83 and the Y-axis galvanoscanner 84 in the present embodiment function as means that replaces the moving mechanism 4 of the laser processing apparatus 1 described above.

The laser oscillator 82, the X-axis galvanoscanner 83, and the Y-axis galvanoscanner 84 described above are controlled by the controller 9 of the laser processing apparatus 1. The laser beam LB emitted by the laser oscillator 82 of the laser beam irradiating unit 80 is swung in the X-axis direction and the Y-axis direction by the X-axis galvanoscanner 83 and the Y-axis galvanoscanner 84 and guided to the fθ lens 85, and is thereafter applied at a desired position of the wafer W4 held on the chuck table 35 via the fθ lens 85. Incidentally, the laser beam irradiating unit is not limited to the galvanoscanners described above, and may be configured using, for example, a polygon mirror, an acoustooptic element, an electrooptic element, or the like.

The processing methods according to the first to fifth embodiments described above can be performed with use of the laser beam irradiating unit 80 described above. In particular, the laser beam irradiating unit 80 is able to irradiate any position with the laser beam LB, and is suitable for performing laser processing on the annular planned processing region W4Ab set on the wafer W4 as the laminated wafer described above. Incidentally, in a case where the size of a region where the laser beam irradiating unit 80 can perform light scanning is smaller than the size of a planned processing region, processing may be performed on the wafer W4 while movement of the X-axis moving mechanism 4*a* and the Y-axis moving mechanism 4*b* is also performed in addition to the scanning with light by the laser beam irradiating unit 80.

In each of the embodiments described above, description has been made of a case where the wafer as a workpiece is a Si wafer. However, the present invention is not limited to this, and the present invention can be carried out in a manner similar to that of each of the embodiments described above by appropriately performing the correlation threshold value generating step and the energy and pulse interval setting step according to the present invention also on a plate-shaped workpiece of another material, for example, such a substrate as a SiC substrate, a GaN substrate, or a sapphire substrate. When the horny layer is formed by irradiating the planned processing region with the laser beam and the horny layer is peeled off and removed from the workpiece, control can be performed such that a region to be peeled off by forming the horny layer is peeled off in an intended region.

The reflection suppressing film described in the first embodiment described above is not limited to being used in the mode of the first embodiment, and can be used in any of the modes of the above-described second to fifth embodiments to provide actions and effects similar to those of the first embodiment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method for processing a workpiece, the method comprising:

a setting step of setting a planned processing region;

a boundary processing step of processing a boundary dividing the planned processing region into a plurality of regions or a boundary dividing the planned processing region and another region from each other;

a correlation threshold value generating step of generating a correlation threshold value from correlation between energy per pulse and a pulse interval of a first laser beam configured to form a horny layer in the planned processing region;

an energy and pulse interval setting step of setting the energy per pulse of the first laser beam equal to or higher than the correlation threshold value and setting the pulse interval of the first laser beam equal to or less than the correlation threshold value;

a horny layer forming step of forming the horny layer by irradiating the planned processing region with the first laser beam, after the setting step, the boundary processing step, and the energy and pulse interval setting step are performed; and a peeling step of peeling off the horny layer from the workpiece.

2. The method for processing the workpiece according to claim 1, wherein the boundary processing step includes a step of forming a groove at the boundary of the workpiece by irradiating the workpiece with a second laser beam having a wavelength absorbable by the workpiece.

3. The method for processing the workpiece according to claim 1, wherein the boundary processing step includes a step of forming a modified layer and a crack extending from the modified layer in an internal part corresponding to the boundary of the workpiece, by irradiating the workpiece with a third laser beam having a wavelength transmissible through the workpiece.

4. The method for processing the workpiece according to claim 2, wherein the boundary processing step includes a step of forming a crack extending along a surface direction of the workpiece, by irradiating the workpiece with a fourth laser beam having a wavelength transmissible through the workpiece while positioning a condensing point of the fourth laser beam at a position corresponding to the boundary of the workpiece and at a depth corresponding to a thickness by which the horny layer is to be formed from one surface of the workpiece.

5. The method for processing the workpiece according to claim 3, wherein the boundary processing step includes a step of forming the crack extending in a surface direction of the workpiece, by irradiating the workpiece with a fourth laser beam having a wavelength transmissible through the workpiece while positioning a condensing point of the fourth laser beam at a position corresponding to the boundary of the workpiece and at a depth corresponding to a thickness by which the horny layer is to be formed from one surface of the workpiece.

6. The method for processing the workpiece according to claim 1, wherein the horny layer is generated by a chain of compressive plastic strains occurring when such a high thermal stress occurs that a local part of the workpiece irradiated with the laser beam attempts to expand rapidly and the high thermal stress is restrained by surroundings having a low temperature and exceeds a yield stress of the workpiece.

7. The method for processing the workpiece according to claim 1, wherein the correlation threshold value is defined by an approximate equation, and when an axis of abscissas is set to indicate the pulse interval (μs) and an axis of ordinates is set to indicate the energy per pulse (μJ), the approximate equation is expressed by $$\text{energy per pulse} = a\{b - (\text{pulse interval}/\mu s - c)^2\}$$

where coefficients a, b, and c are set according to a type of the workpiece.

8. The method for processing the workpiece according to claim 7, wherein, in a case where the workpiece is silicon, settings are made such that a=4, b=1, and c=0.9, the approximate equation is expressed by $$\text{energy per pulse} = 4\{1 - (\text{pulse interval}/\mu s - 0.9)^2\},$$

and the pulse interval is set in a range equal to or more than 0.02 μs but equal to or less than 0.8 μs.

9. The method for processing the workpiece according to claim 1, wherein an irradiation pitch of the laser beam used in the horny layer forming step is set at 10 to 200 nm.

10. The method for processing the workpiece according to claim 1, wherein a pulse width of the laser beam is set in a range of 0.3 to 100 ps.

* * * * *